US012237235B2

(12) United States Patent
Kim et al.

(10) Patent No.: US 12,237,235 B2
(45) Date of Patent: Feb. 25, 2025

(54) SEMICONDUCTOR DEVICE

(71) Applicant: Samsung Electronics Co., Ltd., Suwon-si (KR)

(72) Inventors: Seongkyung Kim, Hwaseong-si (KR); Eunbi Kim, Suwon-si (KR); Ukjin Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 347 days.

(21) Appl. No.: 17/832,900

(22) Filed: Jun. 6, 2022

(65) Prior Publication Data

US 2023/0108684 A1 Apr. 6, 2023

(30) Foreign Application Priority Data

Oct. 6, 2021 (KR) .................. 10-2021-0132605

(51) Int. Cl.
*H01L 21/66* (2006.01)
*H01L 21/8238* (2006.01)
*H01L 27/092* (2006.01)
*H01L 29/45* (2006.01)

(52) U.S. Cl.
CPC ...... *H01L 22/32* (2013.01); *H01L 21/823814* (2013.01); *H01L 21/823821* (2013.01); *H01L 21/823878* (2013.01); *H01L 27/0924* (2013.01); *H01L 29/45* (2013.01)

(58) Field of Classification Search
CPC ............. H01L 22/32; H01L 21/823814; H01L 21/823821; H01L 27/0924; H01L 29/45; H01L 29/41791; H01L 21/823475
See application file for complete search history.

(56) References Cited

U.S. PATENT DOCUMENTS

| 5,598,010 A | * | 1/1997 | Uematsu ............... H01L 23/528 |
| | | | 257/773 |
| 7,973,309 B2 | | 7/2011 | Kim et al. |
| 8,138,497 B2 | | 3/2012 | Zhu et al. |
| 10,177,038 B1 | | 1/2019 | Lee et al. |

(Continued)

FOREIGN PATENT DOCUMENTS

| CN | 1855410 A | 11/2006 |
| CN | 103887280 A | 6/2014 |

(Continued)

*Primary Examiner* — Karen Kusumakar
*Assistant Examiner* — Adam S Bowen
(74) *Attorney, Agent, or Firm* — Muir Patent Law, PLLC

(57) ABSTRACT

A semiconductor device may include a substrate, which includes a logic cell region including first and second active regions and a test region including dummy regions, first and second active patterns provided on the first and second active regions, respectively, a dummy pattern provided on each of the dummy regions, a device isolation layer disposed in trenches defining each of the dummy pattern and the first and second active patterns, a contact pattern provided on the dummy pattern, a gate electrode provided to cross the dummy regions, a gate contact coupled to the gate electrode, and a metal layer on the gate contact. The metal layer may include two test lines provided on the test region and respectively coupled to the contact pattern and the gate contact. A top surface of the first active pattern may be lower than a top surface of the dummy pattern.

20 Claims, 32 Drawing Sheets

(56) References Cited

U.S. PATENT DOCUMENTS

| | | |
|---|---|---|
| 10,396,000 B2 | 8/2019 | Yamashita et al. |
| 2003/0113978 A1 | 6/2003 | Song |
| 2009/0212794 A1 | 8/2009 | Chang et al. |
| 2019/0267366 A1* | 8/2019 | Do .................. H01L 23/5223 |

FOREIGN PATENT DOCUMENTS

| | | |
|---|---|---|
| CN | 110473799 A | 11/2019 |
| CN | 109560001 B | 12/2020 |
| JP | 2007123755 A | 5/2007 |
| JP | 4750489 B2 | 8/2011 |
| KR | 100400254 B1 | 10/2003 |
| KR | 1020090087224 A | 8/2009 |

* cited by examiner

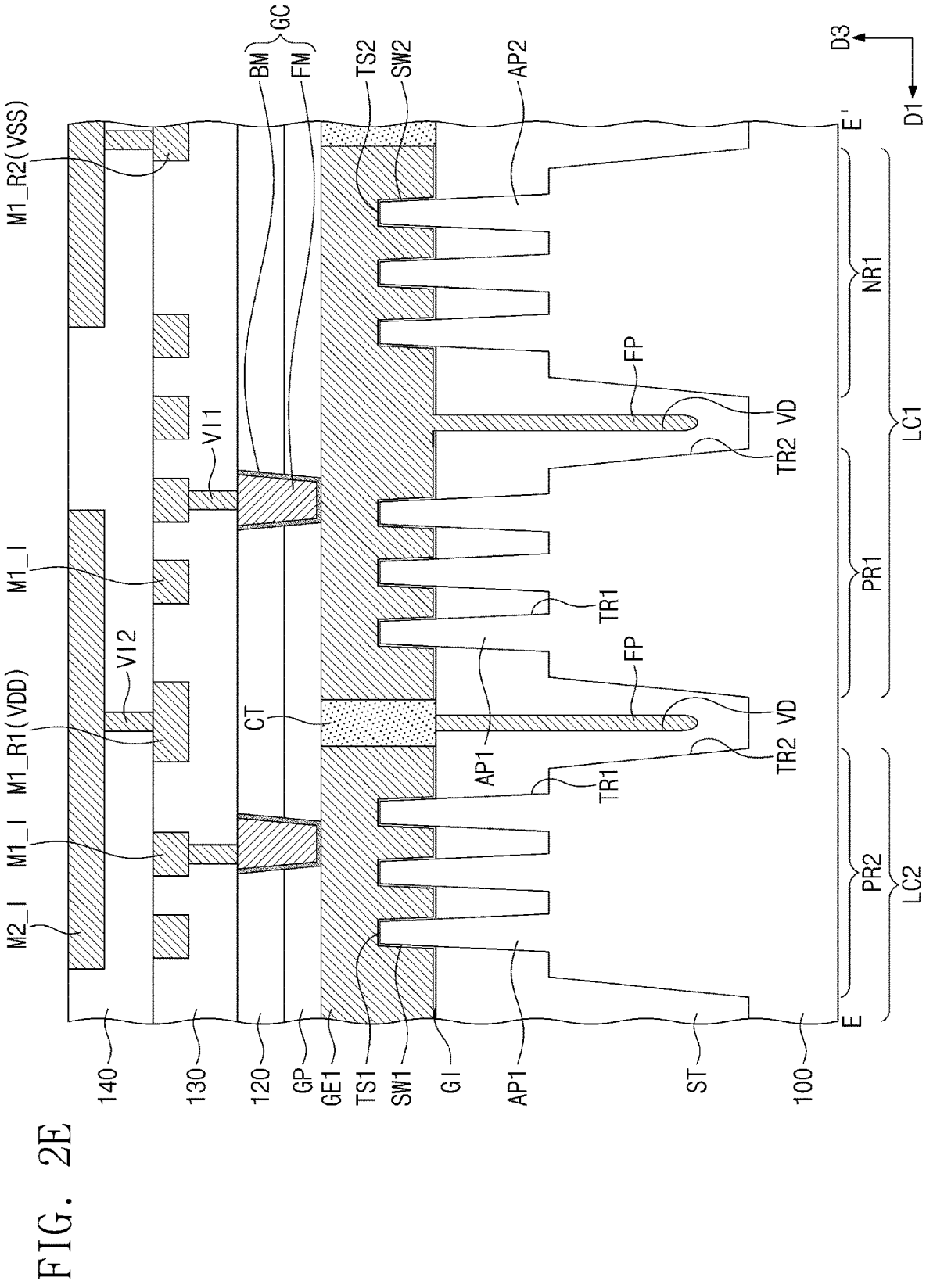

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2021-0132605, filed on Oct. 6, 2021, in the Korean Intellectual Property Office, the entire contents of which are hereby incorporated by reference.

BACKGROUND OF THE INVENTION

The present disclosure relates to a semiconductor device, and in particular, to a semiconductor device including a field effect transistor.

Due to their small-sized, multifunctional, and/or low-cost characteristics, semiconductor devices are being esteemed as essential elements in the electronics industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, structural complexity and/or integration density of semiconductor devices are being increased.

SUMMARY

An embodiment of the inventive concept provides a semiconductor device configured to allow for easier detection or analysis of a failure.

According to an embodiment of the inventive concept, a semiconductor device may include a substrate including a logic cell region and a test region, the logic cell region including a first active region and a second active region, which are spaced apart from each other in a first direction, and the test region including dummy regions, which are spaced apart from each other in the first direction, a first active pattern and a second active pattern provided on the first and second active regions, respectively, a dummy pattern provided on each of the dummy regions, a device isolation layer disposed in trenches defining each of the dummy pattern and the first and second active patterns, a contact pattern provided on the dummy pattern and contacting the dummy pattern, a first gate electrode provided to cross the dummy regions and extended in a first direction, a gate contact coupled to the first gate electrode, and a first metal layer on the gate contact and in the logic cell region and the test region. The first metal layer may include a first test line and a second test line, which are provided on the test region and are respectively coupled to the contact pattern and the gate contact. A top surface of the first active pattern may be lower than a top surface of the dummy pattern.

According to an embodiment of the inventive concept, a semiconductor device may include a substrate including a test region, the test region including dummy regions that are spaced apart from each other in a first direction, dummy patterns provided on the dummy regions, a device isolation layer disposed in trenches, each trench being disposed between corresponding two adjacent dummy patterns, a gate electrode provided to cross the dummy regions and extended in the first direction, a contact pattern provided adjacent to the gate electrode and on the dummy pattern and extended in the first direction, a gate contact provided on the gate electrode, and a first metal layer provided on the gate contact. The first metal layer may include a first test line and a second test line, which are respectively coupled to the contact pattern and the gate contact, and a first via between the first test line and the contact pattern. The gate contact may vertically overlap the device isolation layer between two adjacent dummy regions, and the contact pattern may be in contact with a top surface of each dummy pattern.

According to an embodiment of the inventive concept, a semiconductor device may include a substrate including a logic cell region and a test region, the logic cell region including a first active region and a second active region, which are spaced apart from each other, the test region including dummy regions, which are spaced apart from each other, a first active pattern and a second active pattern provided on the first and second active regions, respectively, a dummy pattern provided on each of the dummy regions, a device isolation layer disposed in trenches defining each of the dummy pattern and the first and second active patterns, each of the dummy pattern and the first and second active patterns protruding beyond a top surface of the device isolation layer, a first gate electrode crossing the first and second active patterns, a second gate electrode crossing the dummy pattern, a first source/drain pattern and a second source/drain pattern provided on the first and second active patterns, respectively, a gate spacer provided on a side surface of each of the first and second gate electrodes, a gate capping pattern provided on a top surface of each of the first and second gate electrodes, an interlayer insulating layer on the gate capping pattern, an active contact penetrating the interlayer insulating layer and coupled to one of the first and second source/drain patterns, a contact pattern penetrating the interlayer insulating layer and contacting the dummy pattern, a pair of silicide patterns interposed between the active contact and each of the first and second source/drain patterns, respectively, a first gate contact and a second gate contact penetrating the interlayer insulating layer and the gate capping pattern and being respectively coupled to the first gate electrode and the second gate electrode, a first metal layer on the interlayer insulating layer, the first metal layer including a power line, which is provided on the logic cell region, and a first test line and a second test line, which are provided on the test region, and a second metal layer on the first metal layer. The power line may be electrically connected to the active contact, the first test line may be electrically connected to the contact pattern, and the second test line may be electrically connected to the second gate contact. A top surface of the first active pattern may be lower than a top surface of the dummy pattern.

BRIEF DESCRIPTION OF THE DRAWINGS

FIGS. 2A to 2H are sectional views, which are respectively taken along lines A-A', B-B', C-C', D-D', E-E', F-F', G-G', and H-H' of FIG. 1.

DETAILED DESCRIPTION

Figure 1:
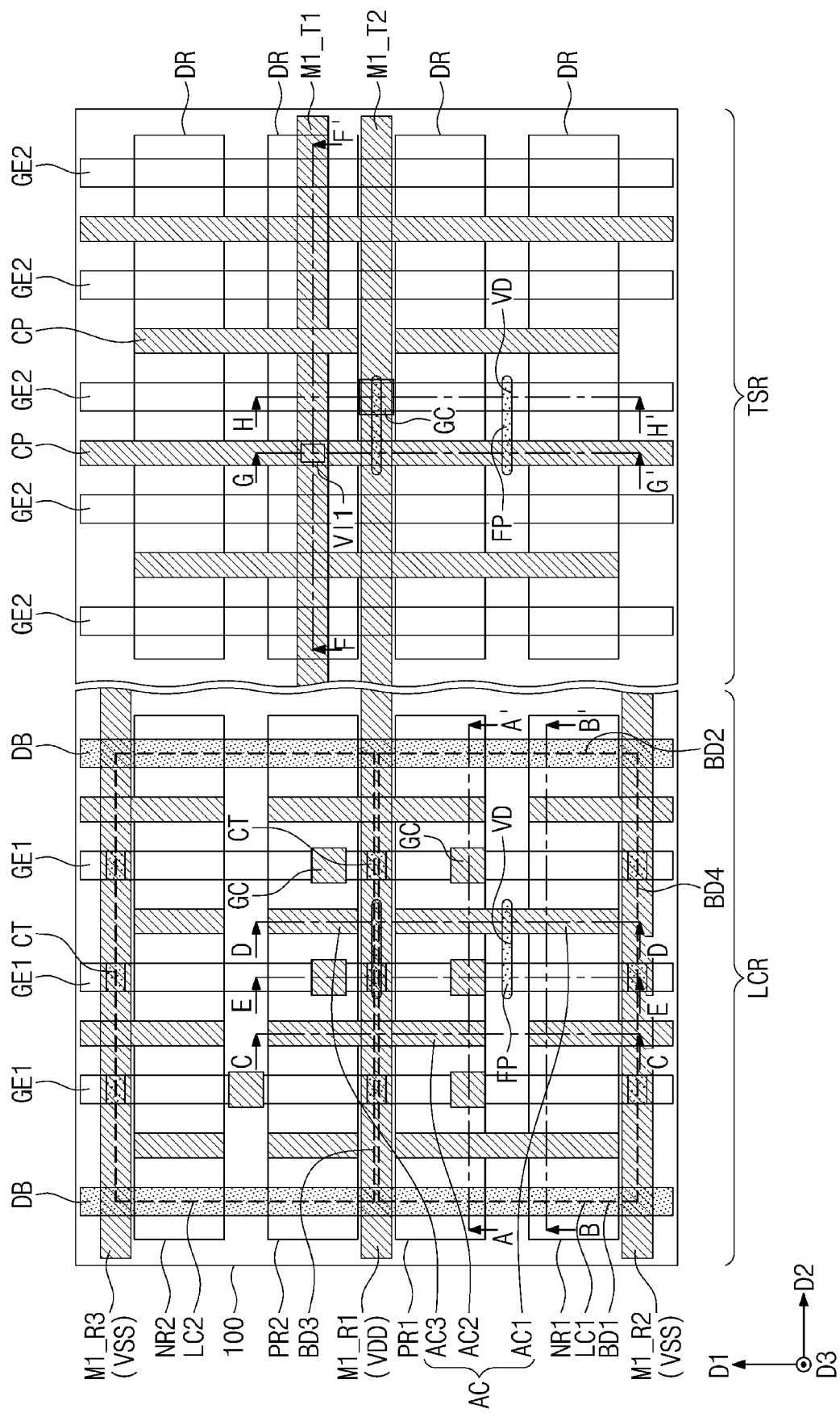
FIG. 1 is a plan view illustrating a semiconductor device according to an embodiment of the inventive concept.

FIG. 1 is a plan view illustrating a semiconductor device according to an embodiment of the inventive concept. FIGS. 2A to 2H are sectional views, which are respectively taken along lines A-A', B-B', C-C', D-D', E-E', F-F', G-G', and H-H' of FIG. 1.

Referring to FIG. 1, a substrate 100 including a logic cell region LCR and a test region TSR may be provided. The substrate 100 may be a semiconductor substrate including silicon, germanium, silicon-germanium, or the like or a compound semiconductor substrate. In some embodiments, the substrate 100 may be a silicon wafer. The logic cell region LCR may be a region of the substrate 100, on which a standard cell constituting a logic circuit is disposed. The test region TSR may be a region of the substrate 100, on which the standard cell constituting the logic circuit is not disposed. In some embodiments, a scribe line may be formed on the test region TSR. The scribe line between undiced chips on a wafer may comprise areas of the wafer in which no circuits (e.g., no transistors) are formed and/or no circuits (e.g., no transistors) are formed that are part of the integrated circuits of the undiced chips. Hereinafter, the logic cell region LCR will be described in more detail with reference to FIGS. 1 and 2A to 2E. As used herein, the term "standard cell" may refer to a unit circuit configured to perform a single logical operation and be composed of a plurality of interconnected MOSFETs. Examples of logic cells include a NAND gate, a NOR gate, an inverter, and a latch. In addition, it will be apparent that the invention is not limited to one or a plurality of standard cells, but may be implemented in connection with one or more transistors, a portion of a transistor, an integrated circuit (e.g., comprising a plurality of interconnected logic cell), a semiconductor chip, a plurality of semiconductor chips (e.g., stacked in a package), etc.

Referring to FIGS. 1 and 2A to 2E, a first logic cell LC1 and a second logic cell LC2 may be provided on the logic cell region LCR of the substrate 100. Logic transistors may be disposed on each of the first and second logic cells LC1 and LC2 to constitute the logic circuit.

The substrate 100 may include active regions PR1, PR2, NR1, and NR2, which are provided on the logic cell region LCR. The active regions PR1, PR2, NR1, and NR2 may include a first P-type metal oxide field effect transistor (PMOSFET) region PR1, a second PMOSFET region PR2, a first N-type metal oxide filed effect transistor (NMOSFET) region NR1, and a second NMOSFET region NR2. Each of the first PMOSFET region PR1, the second PMOSFET region PR2, the first NMOSFET region NR1, and the second NMOSFET region NR2 may be extended in a second direction D2.

The first PMOSFET region PR1, the second PMOSFET region PR2, the first NMOSFET region NR1, and the second NMOSFET region NR2 may be defined by a second trench TR2, which is formed in an upper portion of the substrate 100. For example, the second trench TR2 may be located between the first NMOSFET region NR1 and the first PMOSFET region PR1. The second trench TR2 may be located between the second PMOSFET region PR2 and the second NMOSFET region NR2. The second trench TR2 may be located between the first and second PMOSFET regions PR1 and PR2.

First active patterns AP1 may be provided on each of the first and second PMOSFET regions PR1 and PR2. Second active patterns AP2 may be provided on each of the first and second NMOSFET regions NR1 and NR2. Active patterns may be referred to as active fins. The first and second active patterns AP1 and AP2 may be formed (a) by an epitaxial layer grown from substrate 100 or (b) by etching substrate 100. For example, the first and second active patterns AP1 and AP2 may protrude from a top surface of the substrate 100. It should be noted that in some embodiments, the first and second active patterns AP1 and AP2 may be part of the substrate 100, and in this manner, protruding from the substrate 100 refers to protruding past a top surface of the substrate 100 (e.g., wherein the substrate itself has protrusions that extend beyond a main surface thereof).

The first and second active patterns AP1 and AP2 may be extended in the second direction D2 to be parallel to each other. The first and second active patterns AP1 and AP2 may be vertically-protruding portions of the substrate 100. A first trench TR1 may be defined between adjacent ones of the first active patterns AP1 and between adjacent ones of the second active patterns AP2. The first trench TR1 may be shallower than the second trench TR2. The second trench TR2 may be a deep trench.

A device isolation layer ST may be provided to fill the first and second trenches TR1 and TR2. The device isolation layer ST may include or may be a silicon oxide layer. An upper portion of each of the first and second active patterns AP1 and AP2 may be a protruding pattern, which is vertically extended above the device isolation layer ST (e.g., see FIG. 2E). For example, each of the first and second active patterns AP1 and AP2 may vertically extend beyond a top surface of the device isolation layer ST (e.g., see FIG. 2E). The upper portion of each of the first and second active patterns AP1 and AP2 may be shaped like a fin. The device isolation layer ST may not cover the upper portion of each of the first and second active patterns AP1 and AP2. The device isolation layer ST may cover a lower side surface of each of the first and second active patterns AP1 and AP2.

First source/drain patterns SD1 may be provided on each of the first and second PMOSFET regions PR1 and PR2. The first source/drain patterns SD1 may be provided in the upper portion of each of the first active patterns AP1. The first source/drain patterns SD1 may be impurity regions of a first conductivity type (e.g., p-type). A first channel pattern CH1 may be interposed between a pair of the first source/drain patterns SD1, which are adjacent to each other in the second direction D2.

Second source/drain patterns SD2 may be provided on each of the first and second NMOSFET regions NR1 and NR2. The second source/drain patterns SD2 may be provided in the upper portion of each of the second active patterns AP2. The second source/drain patterns SD2 may be impurity regions of a second conductivity type (e.g., n-type). A second channel pattern CH2 may be interposed between a pair of the second source/drain patterns SD2, which are adjacent to each other in the second direction D2.

The first and second source/drain patterns SD1 and SD2 may be epitaxial patterns, which are formed by a selective epitaxial growth process. In some embodiments, the first and second source/drain patterns SD1 and SD2 may have top surfaces that are coplanar with top surfaces of the first and second channel patterns CH1 and CH2. In some embodiments, the top surfaces of the first and second source/drain patterns SD1 and SD2 may be higher than the top surfaces of the first and second channel patterns CH1 and CH2.

The first source/drain pattern SD1 may include or may be formed of a semiconductor material (e.g., SiGe) having a lattice constant greater than a lattice constant of the substrate 100. The pair of the first source/drain patterns SD1 may exert a compressive stress on the first channel patterns CH1 therebetween. In some embodiments, the second source/drain pattern SD2 may be formed of or may include the same semiconductor material (e.g., Si) as the substrate 100.

First gate electrodes GE1 may be extended in a first direction D1 to cross the first and second active patterns AP1 and AP2. The first gate electrodes GE1 may be arranged at a first pitch in the second direction D2. The first gate electrodes GE1 may vertically overlap the first and second channel patterns CH1 and CH2. Each of the first gate electrodes GE1 may be provided to face a top surface and opposite side surfaces of each of the first and second channel patterns CH1 and CH2.

Referring to FIG. 2E, the first gate electrode GE1 may be provided on a first top surface TS1 of the first channel pattern CH1 and at least one first side surface SW1 of the first channel pattern CH1. The first gate electrode GE1 may be provided on a second top surface TS2 of the second channel pattern CH2 and at least one second side surface SW2 of the second channel pattern CH2. For example, the transistor according to the present embodiment may be a three-dimensional field-effect transistor (e.g., FinFET), in which the first gate electrode GE is provided to surround the channel pattern CH1 or CH2 three-dimensionally.

In some embodiments, the first logic cell LC1 may have a first border BD1 and a second border BD2, which are opposite to each other in the second direction D2. The first and second borders BD1 and BD2 may be extended in the first direction D1. The first logic cell LC1 may have a third border BD3 and a fourth border BD4, which are opposite to each other in the first direction D1. The third and fourth borders BD3 and BD4 may be extended in the second direction D2. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Gate cutting patterns CT may be disposed on the third and fourth borders BD3 and BD4 of the first logic cell LC1. The gate cutting patterns CT may be disposed on a boundary between the first and second logic cells LC1 and LC2 in the first direction D1. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may overlap the first gate electrodes GE1, respectively. The gate cutting patterns CT may be formed of or may include at least one of insulating materials (e.g., silicon oxide or silicon nitride).

The first gate electrode GE1 on the first logic cell LC1 may be spaced apart from the first gate electrode GE1 on the second logic cell LC2 by the gate cutting pattern CT. The gate cutting pattern CT may be interposed between the first gate electrodes GE1 on the first and second logic cells LC1 and LC2, which are aligned to each other in the first direction D1. For example, the first gate electrode GE1 extending in the first direction D1 may be divided into a plurality of the first gate electrodes GE1 by the gate cutting patterns CT.

A pair of gate spacers GS may be disposed on opposite side surfaces of each of the first gate electrodes GE1. The gate spacers GS may be extended along the first gate electrodes GE1 or in the first direction D1. The gate spacers GS may have top surfaces that are higher than top surfaces of the first gate electrodes GE1. The top surfaces of the gate spacers GS may be coplanar with a top surface of a first interlayer insulating layer 110, which will be described below. The gate spacers GS may be formed of or may include at least one of SiCN, SiCON, and SiN. In some embodiments, the gate spacers GS may include or may be a multi-layer containing at least two of SiCN, SiCON, and SiN.

A gate dielectric pattern GI may be interposed between the first gate electrode GE1 and the first active pattern AP1 and between the first gate electrode GE1 and the second active pattern AP2. The gate dielectric pattern GI may be extended along a bottom surface of the first gate electrode GE1 thereon. In some embodiments, the gate dielectric pattern GI may cover the first top surface TS1 and the first side surface SW1 of the first channel pattern CH1. The gate dielectric pattern GI may cover the second top surface TS2 and the second side surfaces SW2 of the second channel pattern CH2. The gate dielectric pattern GI may cover a top surface of the device isolation layer ST below the first gate electrode GE1 (e.g., see FIG. 2E).

In some embodiments, the gate dielectric pattern GI may be formed of or may include a high-k dielectric material whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In some embodiments, the semiconductor device may include a negative capacitance (NC) FET using a negative capacitor. For example, the gate dielectric pattern GI may include or may be formed of a ferroelectric layer exhibiting a ferroelectric property and a paraelectric layer exhibiting a paraelectric property.

The ferroelectric layer may have a negative capacitance. The paraelectric layer may have a positive capacitance. In some embodiments, two or more capacitors may be connected with each other in series and each capacitor has a positive capacitance. A total capacitance of the two or more capacitors may be reduced to a value that is less than a capacitance of each of the capacitors. In some embodiments, at least one of serially-connected capacitors has a negative capacitance, and a total capacitance of the serially-connected capacitors may have a positive value and may be greater than an absolute value of each capacitance. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

In some embodiments, a ferroelectric layer having a negative capacitance and a paraelectric layer having a positive capacitance may be connected with each other in series, and a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or may include at least one of, for example, hafnium oxide, hafnium zirconium oxide, barium strontium titanium oxide, barium titanium oxide, and lead zirconium titanium oxide. The hafnium zirconium oxide may be hafnium oxide that is doped with zirconium (Zr). In some embodiments, the hafnium zirconium oxide may be a compound composed of hafnium (Hf), zirconium (Zr), and/or oxygen (O).

The ferroelectric layer may further include or may be doped with dopants. For example, the dopants may be at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The kind of the dopants in the ferroelectric layer may vary depending on the kind of a ferroelectric material included in the ferroelectric layer.

In some embodiments, the ferroelectric layer may include or may be formed of hafnium oxide, and the dopants in the ferroelectric layer may be at least one of, for example, gadolinium (Gd), silicon (Si), zirconium (Zr), aluminum (Al), and yttrium (Y).

In some embodiments, the dopants may be aluminum (Al), and a content of aluminum in the ferroelectric layer may range from 3 at % to 8 at % (atomic percentage). Here, the content of the dopants (e.g., aluminum atoms) may be a ratio of the number of aluminum atoms to the number of hafnium atoms and aluminum atoms.

In some embodiments, the dopants may be silicon (Si), and a content of silicon in the ferroelectric layer may range from 2 at % to 10 at %. In some embodiments, the dopants may be yttrium (Y), and a content of yttrium in the ferroelectric layer may range from 2 at % to 10 at %. In some embodiments, the dopants may be gadolinium (Gd), and a content of gadolinium in the ferroelectric layer may range from 1 at % to 7 at %. In some embodiments, the dopants may be zirconium (Zr), and a content of zirconium in the ferroelectric layer may range from 50 at % to 80 at %.

The paraelectric layer may have the paraelectric property. The paraelectric layer may be formed of or may include at least one of, for example, silicon oxide and a high-k metal oxide. The high-k metal oxide, which can be used as the paraelectric layer, may include at least one of, for example, hafnium oxide, zirconium oxide, and aluminum oxide, but the inventive concept is not limited to these examples.

The ferroelectric layer and the paraelectric layer may be formed of or may include the same material. The ferroelectric layer may have the ferroelectric property, but the paraelectric layer may not have the ferroelectric property. In some embodiments, the ferroelectric and paraelectric layers may contain hafnium oxide, and a crystal structure of the hafnium oxide in the ferroelectric layer may be different from a crystal structure of the hafnium oxide in the paraelectric layer.

The ferroelectric layer may exhibit the ferroelectric property only at a thickness in a specific range. In some embodiments, the ferroelectric layer having the ferroelectric property may have a thickness ranging from 0.5 nanometer (nm) to 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

In some embodiments, the gate dielectric pattern GI may include a single ferroelectric layer. In some embodiments, the gate dielectric pattern GI may include a plurality of ferroelectric layers that are spaced apart from each other. The gate dielectric pattern GI may have a multi-layered structure, in which a plurality of ferroelectric layers and a plurality of paraelectric layers are alternately stacked on each other.

The first gate electrode GE1 may include a first metal pattern and a second metal pattern on the first metal pattern. The first metal pattern may be provided on the gate dielectric pattern GI and near the first and second channel patterns CH1 and CH2. The first metal pattern may include a work-function metal, which can be used to adjust a threshold voltage of the transistor. By adjusting a thickness and composition of the first metal pattern, it may be possible to realize a transistor having a desired threshold voltage.

The first metal pattern may include or may be a metal nitride layer. For example, the first metal pattern may include or may be a layer that is formed of nitrogen (N) and at least one metallic material, which is selected from the group consisting of titanium (Ti), tantalum (Ta), aluminum (Al), tungsten (W) and molybdenum (Mo). In some embodiments, the first metal pattern may further include carbon (C). The first metal pattern may include a plurality of work function metal layers, which are stacked on each other.

The second metal pattern may be formed of or may include a metallic material whose resistance is lower than the first metal pattern. For example, the second metal pattern may include or may be formed of at least one metallic material, which is selected from the group consisting of tungsten (W), aluminum (Al), titanium (Ti), and tantalum (Ta).

A first interlayer insulating layer 110 may be provided on the substrate 100. The first interlayer insulating layer 110 may cover the gate spacers GS and the first and second source/drain patterns SD1 and SD2. A top surface of the first interlayered insulating layer 110 may be substantially coplanar with top surfaces of gate capping patterns GP and the top surfaces of the gate spacers GS. A second interlayer insulating layer 120 may be provided on the first interlayer insulating layer 110 to cover the gate capping patterns GP. A third interlayer insulating layer 130 may be provided on the second interlayer insulating layer 120. A fourth interlayer insulating layer 140 may be provided on the third interlayer insulating layer 130. In some embodiments, at least one of the first to fourth interlayer insulating layers 110 to 140 may include or may be formed of a silicon oxide layer. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

A pair of division structures DB may be provided at opposite sides of each of the first and second logic cells LC1 and LC2 to be opposite to each other in the second direction D2. For example, the pair of the division structures DB may be respectively provided on the first and second borders BD1 and BD2 of the first logic cell LC1. The division structure DB may be extended in the first direction D1 or parallel to the first gate electrodes GE1. A center-to-center distance between the division structure DB and the first gate electrode GE1 adjacent thereto may be equal to the first pitch.

The division structure DB may be provided to penetrate the first and second interlayer insulating layers 110 and 120 and may be extended into the first and second active patterns AP1 and AP2. The division structure DB may be provided to penetrate an upper portion of each of the first and second active patterns AP1 and AP2. The division structure DB may electrically separate an active region of each of the first and second logic cells LC1 and LC2 from an active region of a neighboring cell.

Active contacts AC may be provided to penetrate the first and second interlayer insulating layers 110 and 120 and may be electrically connected to the first and second source/drain patterns SD1 and SD2, respectively. Each of the active contacts AC may be provided between a pair of the first gate electrodes GE1. When viewed in a plan view, each of the active contacts AC may be a bar- or line-shaped pattern extending in the first direction D1.

The active contact AC may be a self-aligned contact. For example, the active contact AC may be formed by a self-alignment process using the gate capping pattern GP and the gate spacer GS. In some embodiments, the active contact AC may cover at least a portion of the side surface of the gate spacer GS. Although not shown, the active contact AC may be provided to cover a portion of the top surface of the gate capping pattern GP.

Silicide patterns SC may be respectively interposed between the active contacts AC and the first and second source/drain patterns SD1 and SD2. The active contacts AC may be electrically connected to the first and second source/drain patterns SD1 and SD2, respectively, through the silicide patterns SC. The silicide pattern SC may be formed of or may include at least one of metal silicide materials (e.g., titanium silicide, tantalum silicide, tungsten silicide, nickel silicide, and cobalt silicide).

The active contacts AC may include a first active contact AC1, a second active contact AC2, and a third active contact AC3. The first active contact AC1 on the first logic cell LC1 may be provided to electrically connect the first source/drain pattern SD1 of the first PMOSFET region PR1 to the second source/drain pattern SD2 of the first NMOSFET region NR1. The first active contact AC1 may be extended from the second source/drain pattern SD2 of the first NMOSFET region NR1 to the first source/drain pattern SD1 of the first PMOSFET region PR1 in the first direction D1.

The second active contact AC2 may electrically connect the first source/drain pattern SD1 of the first PMOSFET region PR1 to the first source/drain pattern SD1 of the second PMOSFET region PR2. The second active contact AC2 may be extended from the first source/drain pattern SD1 of the first PMOSFET region PR1 to the first source/drain pattern SD1 of the second PMOSFET region PR2 in the first direction D1. The second active contact AC2 may be provided across a border (e.g., the third border BD3) between the first and second logic cells LC1 and LC2 and may be coupled to the first PMOSFET region PR1 of the first logic cell LC1 and the second PMOSFET region PR2 of the second logic cell LC2. For example, the second active contact AC2 may be disposed on both the first PMOSFET region PR1 of the first logic cell LC1 and the second PMOSFET region PR2 of the second logic cell LC2.

The third active contact AC3 on the second logic cell LC2 may be locally provided on only the first source/drain pattern SD1 of the second PMOSFET region PR2 or the second source/drain pattern SD2 of the second NMOSFET region NR2. Unlike the first and second active contacts AC1 and AC2 as described above, the third active contact AC3 may be locally disposed on a single active region without connecting adjacent active regions with each other.

When viewed in a plan view, a length of the third active contact AC3 in the first direction D1 may be shorter than a length of each of the first and second active contacts AC1 and AC2 in the first direction D1. For example, the length of the third active contact AC3 may be smaller than half of the length of each of the first and second active contacts AC1 and AC2.

Gate contacts GC may be provided to penetrate the second interlayer insulating layer 120 and the gate capping pattern GP to be electrically connected to the first gate electrodes GE1, respectively. When viewed in a plan view, the gate contacts GC on the first logic cell LC1 may vertically overlap the first PMOSFET region PR1. For example, the gate contacts GC on the first logic cell LC1 may be provided on the first active pattern AP1 (e.g., see FIG. 1).

In some embodiments, the gate contact GC may be disposed on the first gate electrode GE1 without any limitation in position. For example, the gate contacts GC on the second logic cell LC2 may be respectively disposed on the second PMOSFET region PR2 and the device isolation layer ST filling the second trench TR2. Although not shown, the gate contacts GC on the second logic cell LC2 may be disposed on the second NMOSFET region NR2.

Figure 2A:
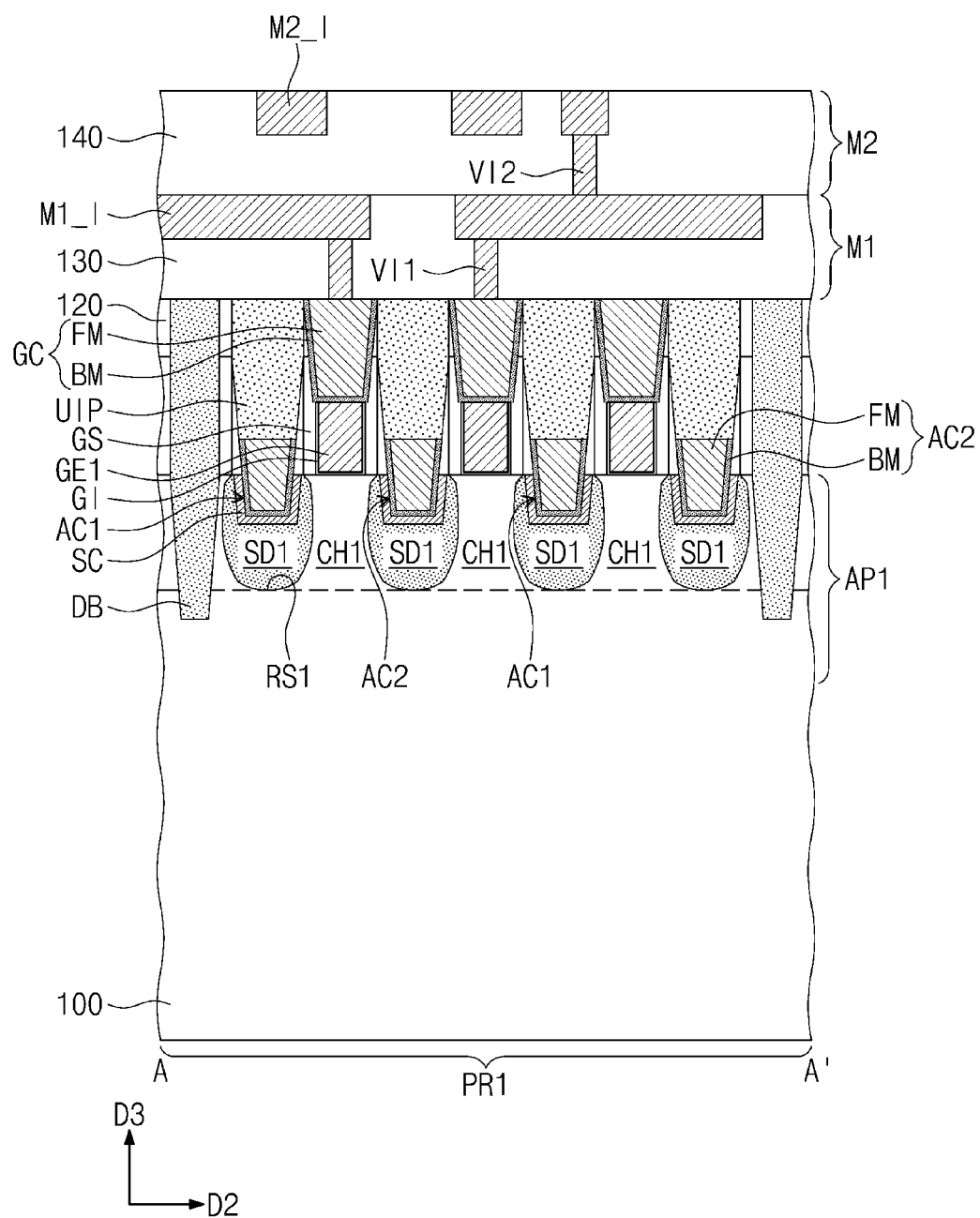
Figure 2B:
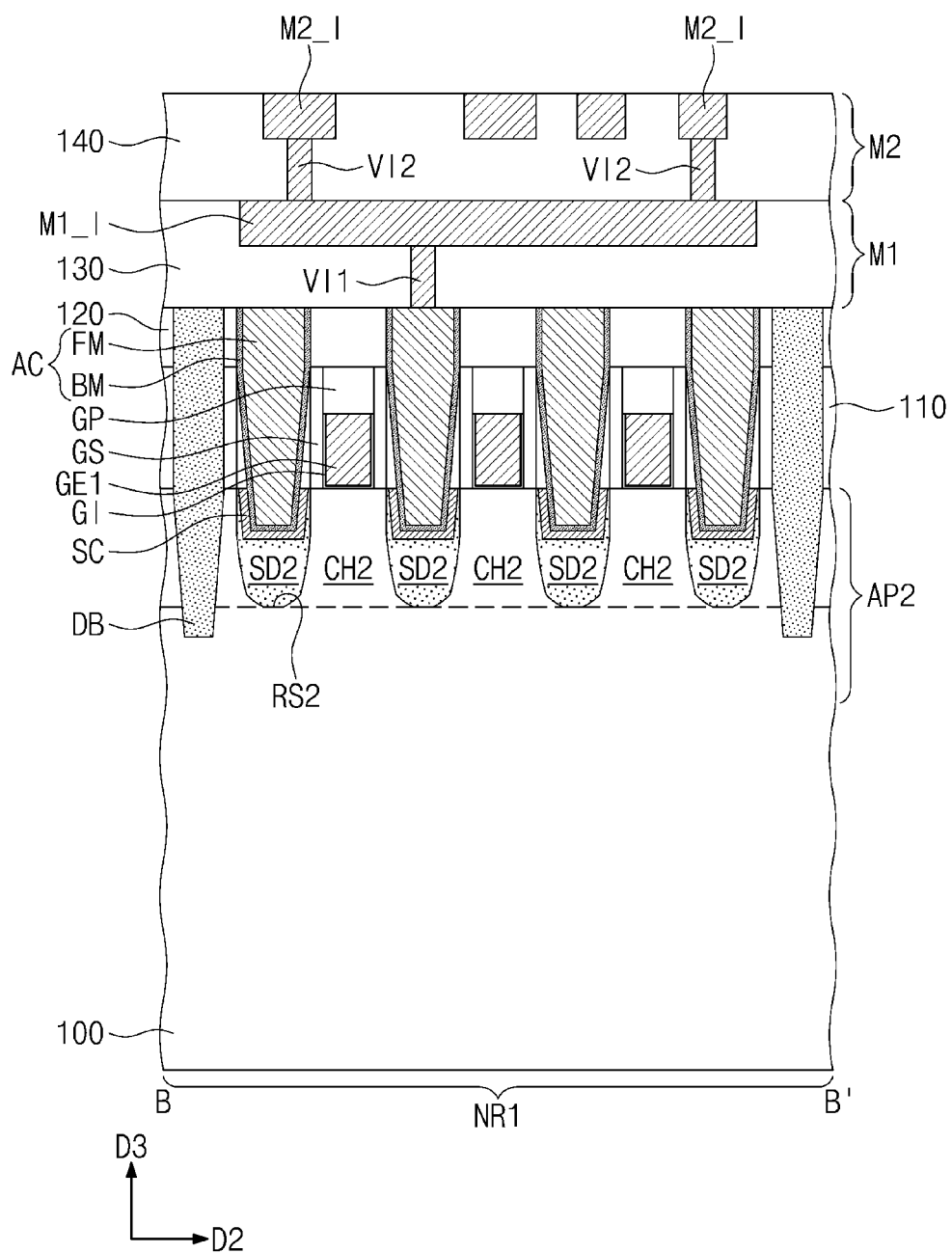
Figure 2C:
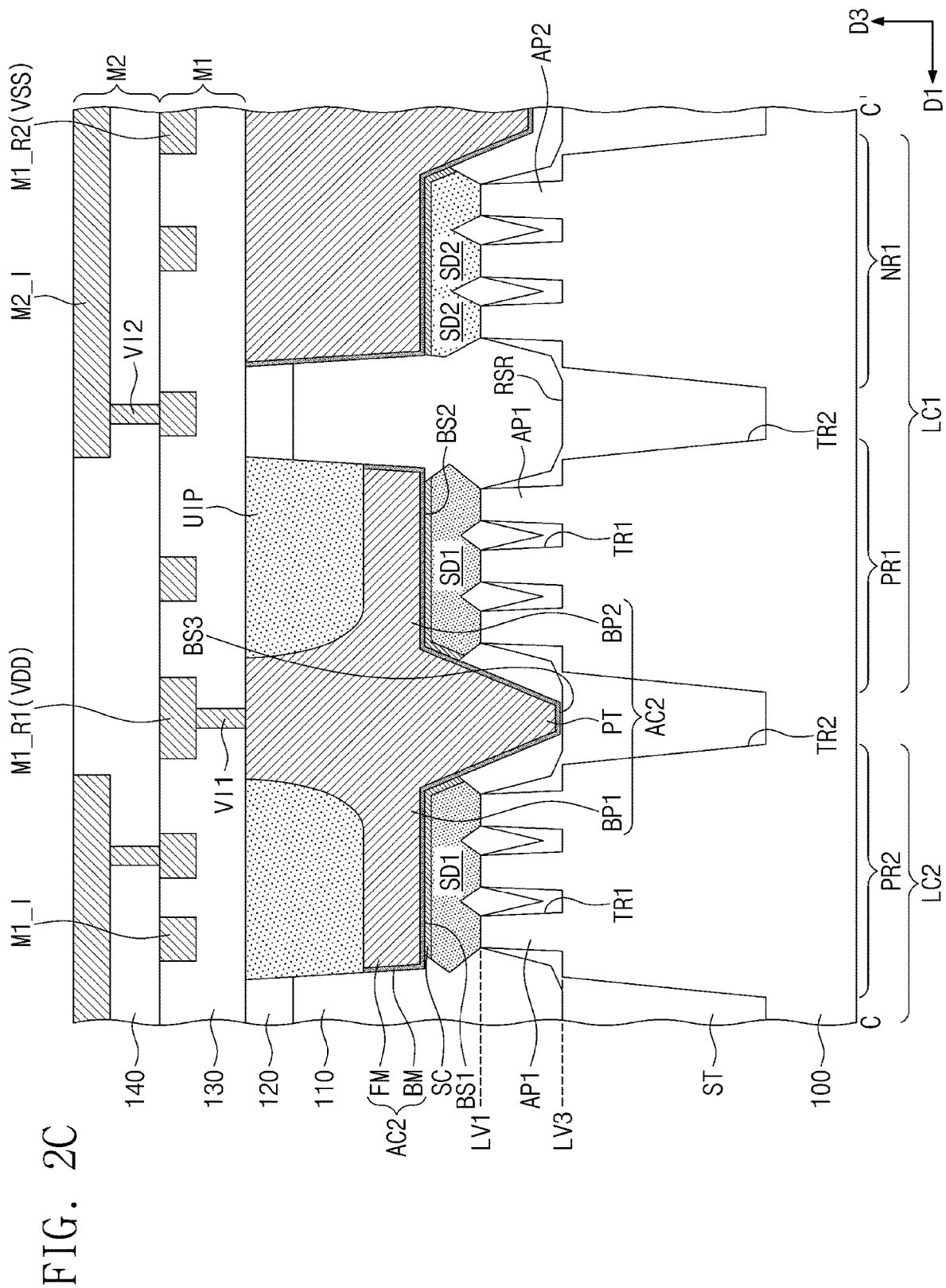
Figure 2D:
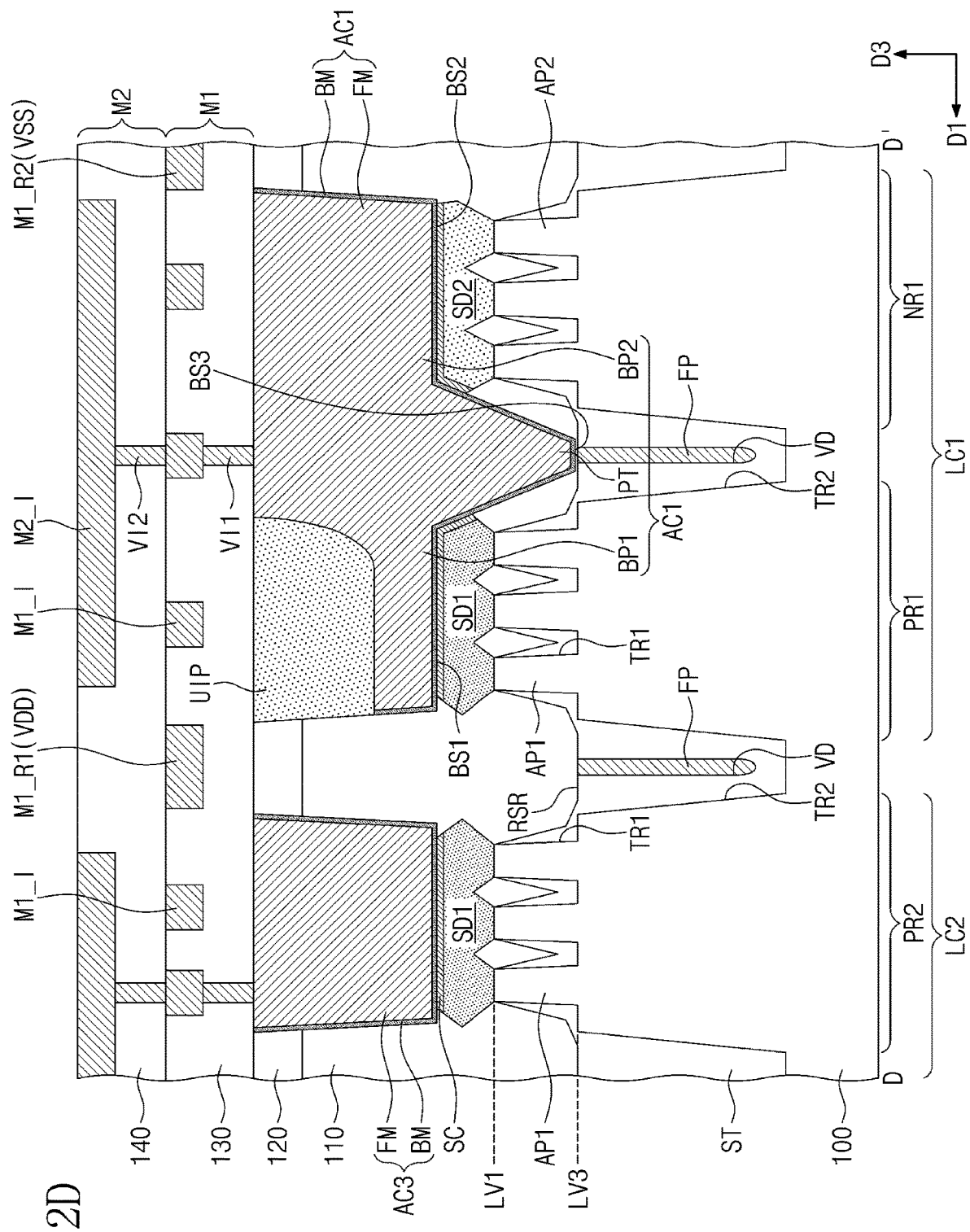

Referring to FIGS. 2A, 2C, and 2D, an upper region of each of the active contacts AC adjacent to the gate contact GC may be filled with an upper insulating pattern UIP. A bottom surface of the upper insulating pattern UIP may be lower than a bottom surface of the gate contact GC. A top surface of the active contact AC adjacent to the gate contact GC may be lower than the bottom surface of the gate contact GC. The top surface of the active contact AC may be covered with the upper insulating pattern UIP (e.g., see FIG. 2A). Accordingly, it may be possible to prevent the gate contact GC and the active contact AC, which are adjacent to each other, from being in contact with each other and thereby to prevent a short circuit issue from occurring.

Each of the active and gate contacts AC and GC may include a conductive pattern FM and a barrier pattern BM enclosing the conductive pattern FM. For example, the conductive pattern FM may be formed of or may include at least one of metallic materials (e.g., aluminum, copper, tungsten, molybdenum, and cobalt). The barrier pattern BM may be provided to cover side and bottom surfaces of the conductive pattern FM. In some embodiments, the barrier pattern BM may include a metal layer and a metal nitride layer. The metal layer may be formed of or may include at least one of titanium, tantalum, tungsten, nickel, cobalt, and platinum. The metal nitride layer may be formed of or may include at least one of titanium nitride (TiN), tantalum nitride (TaN), tungsten nitride (WN), nickel nitride (NiN), cobalt nitride (CON), and platinum nitride (PtN).

A first metal layer M1 may be provided in the third interlayer insulating layer 130. For example, the first metal layer M1 may include a first power line M1_R1, a second power line M1_R2, a third power line M1_R3, and first interconnection lines M1_I. The interconnection lines M1_R1, M1_R2, M1_R3, and M1_I of the first metal layer M1 may be extended in the second direction D2 to be parallel to each other.

The first and second power lines M1_R1 and M1_R2 may be respectively provided on the third and fourth borders BD3 and BD4 of the first logic cell LC1. The first power line M1_R1 may be extended along the third border BD3 and in the second direction D2. The second power line M1_R2 may be extended along the fourth border BD4 and in the second direction D2.

The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first to third power lines M1_R1, M1_R2, and M1_R3.

The first power line M1_R1 may be a conduction path, to which a drain voltage VDD (e.g., a power voltage) is provided. The second power line M1_R2 may be a conduction path, to which a source voltage VSS (e.g., a ground voltage) is provided. The first power line M1_R1 may be disposed between the second power line M1_R2 and the third power line M1_R3. The third power line M1_R3 may be a conduction path, to which the source voltage VSS (e.g., the ground voltage) is provided.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1 R1. When viewed in a plan view, the first power line M1_R1 may be disposed between the first and second PMOSFET regions PR1 and PR2.

The first metal layer M1 may further include first vias VI1. The first vias VI1 may be respectively provided below the interconnection lines M1_R1, M1_R2, M1_R3, and M1_I of the first metal layer M1. The active contact AC and the interconnection line of the first metal layer M1 may be electrically connected with each other through the first via VI1. The gate contact GC and the interconnection line of the first metal layer M1 may be electrically connected with each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the present embodiment may be fabricated using a sub-20 nm process. The present invention is not limited thereto. In some embodiments, the semiconductor device may be fabricated using a process for forming below 20 nm nodes.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern extending in the first direction D1. For example, the second interconnection lines M2_I may be extended in the first direction D1 and parallel to each other.

The second metal layer M2 may further include second vias VI2, which are respectively provided below the second interconnection lines M2_I. The interconnection line of the first metal layer M1 and the interconnection line of the second metal layer M2 may be electrically connected with each other through the second via VI2. The interconnection line of the second metal layer M2 and the second via VI2 thereunder may be formed together by a dual damascene process.

The interconnection lines of the first metal layer M1 may be formed of or may include a conductive material that is the same as or different from a conductive material of the second metal layer M2. For example, the interconnection lines of the first and second metal layers M1 and M2 may be formed of or may include at least one of metallic materials (e.g., aluminum, copper, tungsten, molybdenum, and cobalt). Although not shown, a plurality of metal layers (e.g., M3, M4, M5, and so forth) may be additionally disposed on the fourth interlayer insulating layer 140. Each of the stacked metal layers may include interconnection lines for routing between cells.

The active contact AC will be described in more detail with reference to FIGS. 2C and 2D. The first active contact AC1 may include a first body portion BP1 on the first source/drain pattern SD1 and a second body portion BP2 on the second source/drain pattern SD2. The first body portion BP1 of the first active contact AC1 may be connected to a top surface of the first source/drain pattern SD1 through the silicide pattern SC, and the second body portion BP2 of the first active contact AC1 may be connected to a top surface of the second source/drain pattern SD2 through the silicide pattern SC. The second active contact AC2 may include the first body portion BP1 on the first source/drain pattern SD1 of the second logic cell LC2 and the second body portion BP2 on the first source/drain pattern SD1 of the first logic cell LC1. Each of the first and second body portions BP1 and BP2 of the second active contact AC2 may be connected to the top surface of the first source/drain pattern SD1 through the silicide pattern SC.

Each of the first and second active contacts AC1 and AC2 may include a protruding portion PT between the first and second body portions BP1 and BP2. The protruding portion PT of the first active contact AC1 may be provided on the device isolation layer ST between the first PMOSFET region PR1 and the first NMOSFET region NR1. The protruding portion PT of the second active contact AC2 may be provided on the device isolation layer ST between the first PMOSFET region PR1 and the second PMOSFET region PR2. The protruding portion PT may be a portion protruding toward the device isolation layer ST. In some embodiments, the protruding portion PT of the first active contact AC1 may be in contact with the device isolation layer ST between the first PMOSFET region PR1 and the first NMOSFET region NR1. The protruding portion PT of the second active contact AC2 may be in contact with the device isolation layer ST between the first PMOSFET region PR1 and the second PMOSFET region PR2.

The protruding portion PT may be extended toward the device isolation layer ST along an inclined side surface of the first or second source/drain pattern SD1 or SD2. A bottom surface BS3 of the protruding portion PT may be lower than a bottom surface BS1 of the first body portion BP1 and a bottom surface BS2 of the second body portion BP2. The bottom surface BS3 of the protruding portion PT may be in contact with the device isolation layer ST. However, in some embodiments, the bottom surface BS3 of the protruding portion PT may be spaced apart from the device isolation layer ST.

Each of the first and second active contacts AC1 and AC2 may be connected to the inclined side surface of the first or second source/drain pattern SD1 or SD2 through the protruding portion PT. For example, the presence of the protruding portion PT may increase a contact area between the active contact AC and the source/drain patterns SD1 and SD2. Thus, an electric resistance between the active contact AC and the source/drain patterns SD1 and SD2 may be lowered.

The top surface of the device isolation layer ST may be provided to define a recess region RSR, which is recessed toward one of the second trenches TR2. The recess region RSR may be formed on only the logic cell region LCR, on which the first and second source/drain patterns SD1 and SD2 are formed. Each of the protruding portions PT of the first and second active contacts AC1 and AC2 may be extended into the recess region RSR.

The device isolation layer ST may include a void VD, which is vertically extended into one of the second trenches TR2. When viewed in a plan view, the void VD may be extended in the second direction D2. The void VD may be an empty space which is extended from the top surface of the device isolation layer ST toward a bottom surface of the second trench TR2. The void VD may be provided in the second trench TR2. The void VD may be formed when the deep trench (i.e., the second trench TR2) is not fully filled with the device isolation layer ST. In some embodiments, the void VD may not be provided in the second trench TR2 (e.g., see FIG. 1).

A gapfill pattern FP may be provided in the void VD. The gapfill pattern FP may be provided to fully fill the void VD. In some embodiments, the gapfill pattern FP may be provided to partially fill the void VD. As will be described below, the gapfill pattern FP may be formed by filling the void VD with a metallic material which is used in a process of forming the first gate electrode GEL or the active contacts AC.

The gapfill pattern FP may be formed of or may include a metallic material. In some embodiments, the gapfill pattern FP may include or may be a metal nitride layer. For example, the gapfill pattern FP may include or may be formed of nitrogen (N) and at least one metallic element, which is selected from the group consisting of titanium (Ti), tantalum (Ta), aluminum (Al), tungsten (W) and molybdenum (Mo). The gapfill pattern FP may further include carbon (C). In some embodiments, the gapfill pattern FP may be formed of or may include at least one metallic material, which is selected from the group consisting of tungsten (W), aluminum (Al), titanium (Ti), and tantalum (Ta).

A portion of the first gate electrode GE1 may be extended into the void VD. The gapfill pattern FP may include the portion of the first gate electrode GE1. Although not shown, a portion of the gate dielectric pattern GI may be extended into the void VD. In some embodiments, the gapfill pattern FP may be formed of or may include the same material as the barrier pattern BM or the conductive pattern FM. The protruding portion PT of the first active contact AC1 may be in contact with the gapfill pattern FP. In this case, due to the gapfill pattern FP, a short circuit issue may occur between the first active contact AC1 and the first gate electrode GE1 adjacent thereto. The occurrence of the short circuit issue may depend on a width of the void VD in the second direction D2, a distance between the active contact AC and the first gate electrode GE1, the presence or absence of the gapfill pattern FP, or the like. In some embodiments, the protruding portion PT of the first active contact AC1 may be spaced apart from the gapfill pattern FP.

Hereinafter, the test region TSR will be described in more detail with reference to FIGS. 1 and 2F to 2H. Referring to FIGS. 1 and 2F to 2H, the substrate 100 may have dummy regions DR on the test region TSR. The dummy regions DR may be defined by the second trench TR2 formed in an upper portion of the substrate 100. The dummy regions DR may be spaced apart from each other in the first direction D1. The second trench TR2 may be located between the dummy regions DR, which are adjacent to each other in the first direction D1. Each of the dummy regions DR may be extended in the second direction D2.

Dummy patterns DP may be provided on each of the dummy regions DR. The dummy patterns DP may be extended in the second direction D2 to be parallel to each other. The dummy patterns DP may be vertically-protruding portions of the substrate 100. The first trench TR1 may be defined between the dummy patterns DP which are adjacent to each other. The first trench TR1 may be shallower than the second trench TR2. The first and second source/drain patterns SD1 and SD2 may not be formed on the dummy patterns DP, unlike the first and second active patterns AP1 and AP2. Since the first and second source/drain patterns SD1 and SD2 are not formed on the test region TSR, it may be possible to prevent a short circuit from being formed between the first and second source/drain patterns SD1 and SD2 and a second gate electrode GE2 adjacent thereto. Accordingly, it may be possible to prevent an error from occurring in a short circuit detecting step to be described below. As used herein, the term "dummy" is used to refer to a component that has the same or similar structure and shape as other components but does not have a substantial function and exists only as a pattern in the device.

The device isolation layer ST may be provided to fill the first and second trenches TR1 and TR2. An upper portion of each of the dummy patterns DP may vertically protrude above the device isolation layer ST (e.g., see FIG. 2H). For example, the dummy patterns DP may vertically protrude beyond a top surface of the device isolation layer ST (e.g., see FIG. 2H). The upper portion of each of the dummy patterns DP may be shaped like a fin. The device isolation layer ST may not cover the upper portion of each of the dummy patterns DP. The device isolation layer ST may cover a lower side surface of each of the dummy patterns DP.

Second gate electrodes GE2 may be provided to cross the dummy patterns DP and to extend in the first direction D1. The second gate electrodes GE2 may be arranged in the second direction D2. Referring to FIG. 2H, the second gate electrode GE2 may be provided on a top surface TS of the dummy pattern DP and at least one side surface SW of the dummy pattern DP. Unlike the logic cell region LCR, the gate cutting pattern CT may not be provided on the test region TSR. The second gate electrode GE2 may be extended in the first direction D1 to cross the dummy regions DR (e.g., see FIG. 1). The second gate electrode GE2 may have substantially the same structure as the first gate electrode GE1.

A pair of the gate spacers GS may be disposed on opposite side surfaces of each of the second gate electrodes GE2. The gate spacers GS may be extended along the second gate electrodes GE2 or in the first direction D1. The gate capping pattern GP may be provided on each of the second gate electrodes GE2. The gate capping pattern GP may be extended along the second gate electrode GE2 or in the first direction D1. The gate dielectric pattern GI may be interposed between the second gate electrode GE2 and the dummy pattern DP.

Contact patterns CP may be provided to penetrate the first and second interlayer insulating layers 110 and 120 and to be in contact with the dummy patterns DP. Each of the contact patterns CP may be in contact with the top surfaces of the dummy patterns DP. Each of the contact patterns CP may be provided between a pair of the second gate electrodes GE2. When viewed in a plan view, each of the contact patterns CP may be a bar- or line-shaped pattern, which is extended in the first direction D1.

The contact pattern CP may be a self-aligned contact. For example, the contact pattern CP may be formed in a self-aligned manner using the gate capping pattern GP and the gate spacer GS. For example, the contact pattern CP may cover at least a portion of a side surface of the gate spacer GS. Although not shown, the contact pattern CP may cover a portion of the top surface of the gate capping pattern GP.

The contact pattern CP may be extended in the first direction D1 to cross the dummy regions DR. The contact pattern CP may include body portions BP, which are provided on the dummy patterns DP, and the protruding portion PT, which is provided between the body portions BP. The protruding portion PT may be a portion which is placed between adjacent dummy regions DR and is extended toward one of the second trenches TR2.

The gate contact GC may be provided to penetrate the second interlayer insulating layer 120 and the gate capping pattern GP to be electrically connected to one of the second gate electrodes GE2. The gate contact GC on the test region TSR may vertically overlap the device isolation layer ST between the dummy regions DR, when viewed in a plan view. Each of the contact pattern CP and the gate contact GC may include the conductive pattern FM and the barrier pattern BM enclosing the conductive pattern FM.

Figure 2F:
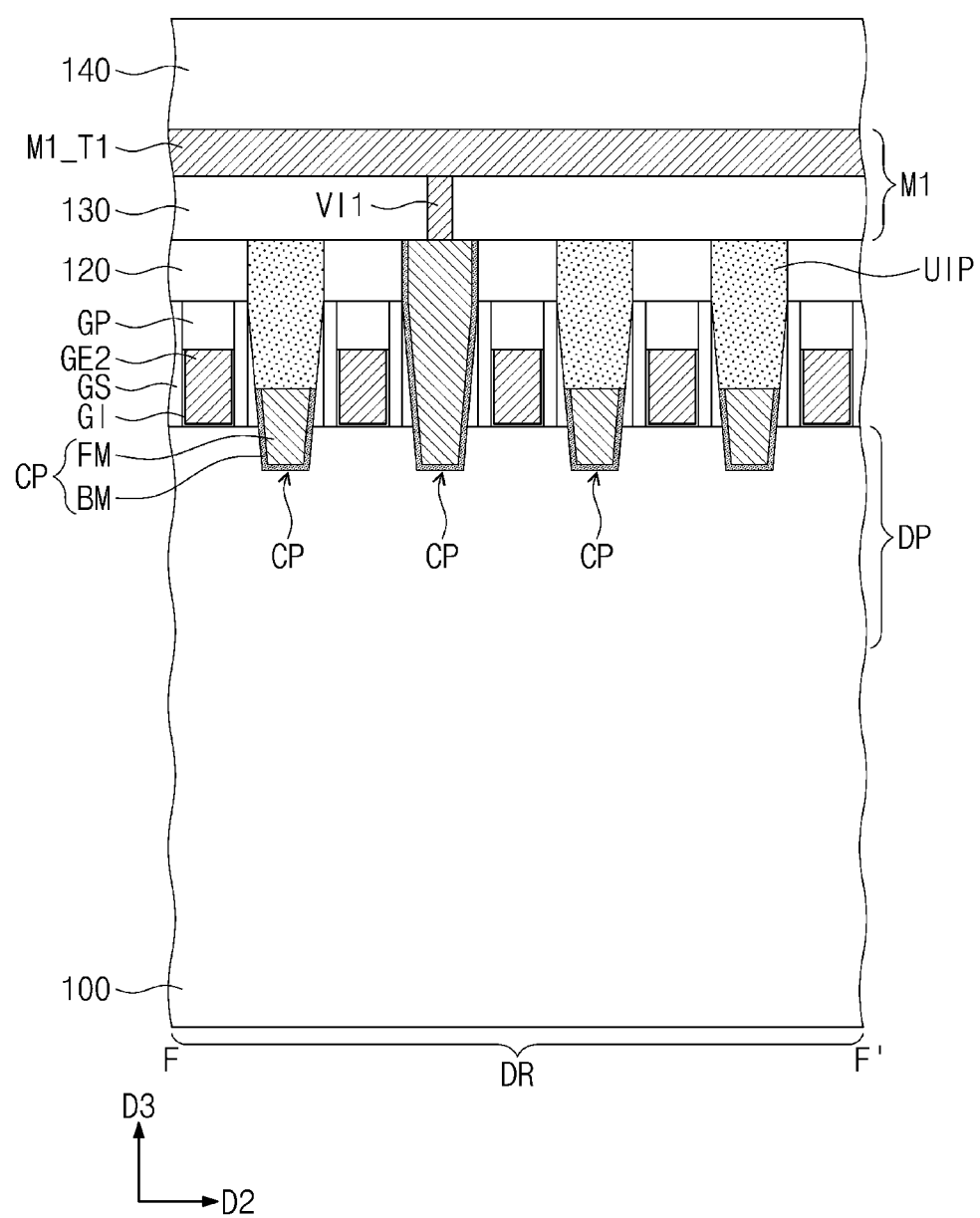
Figure 2G:
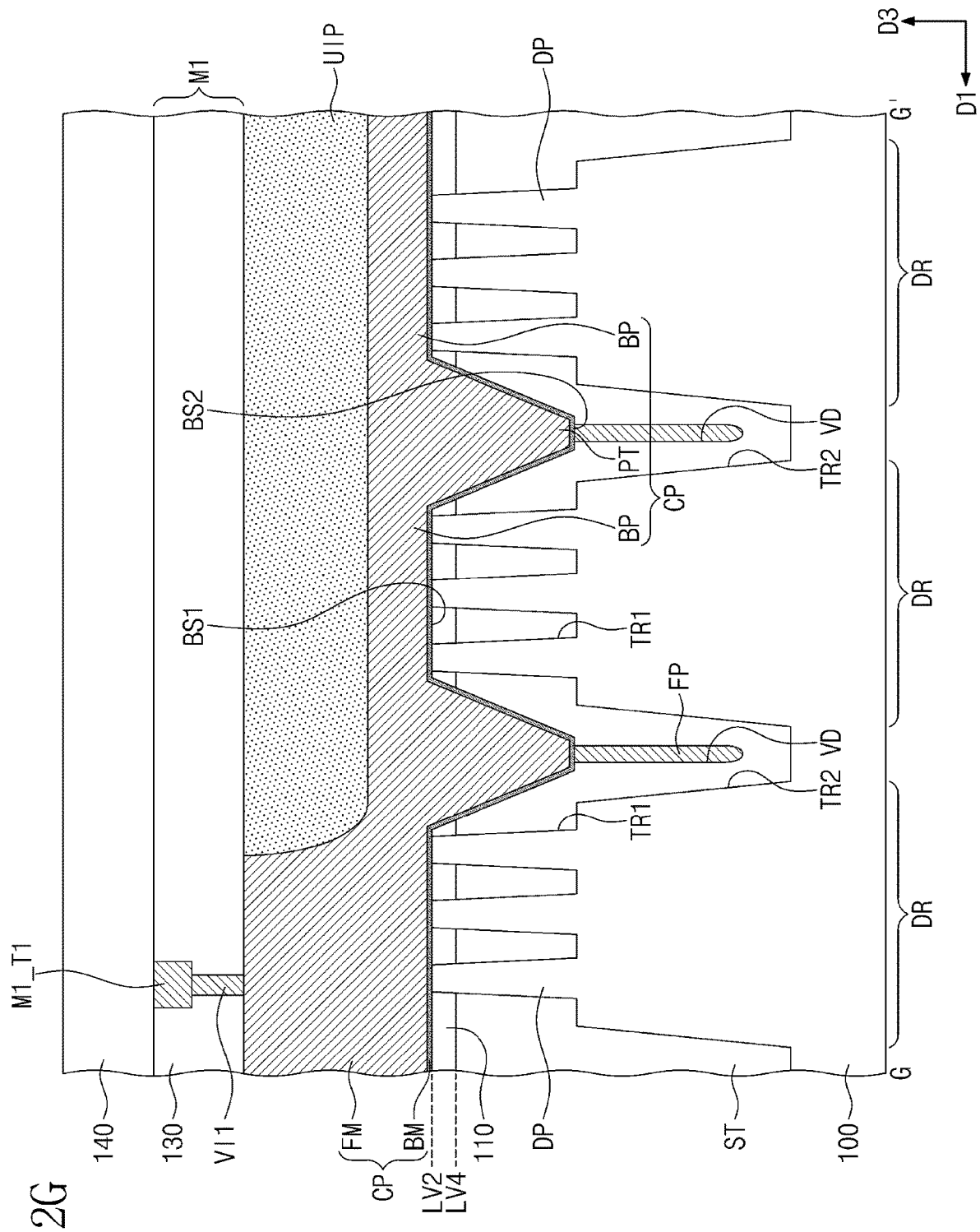
Figure 2H:
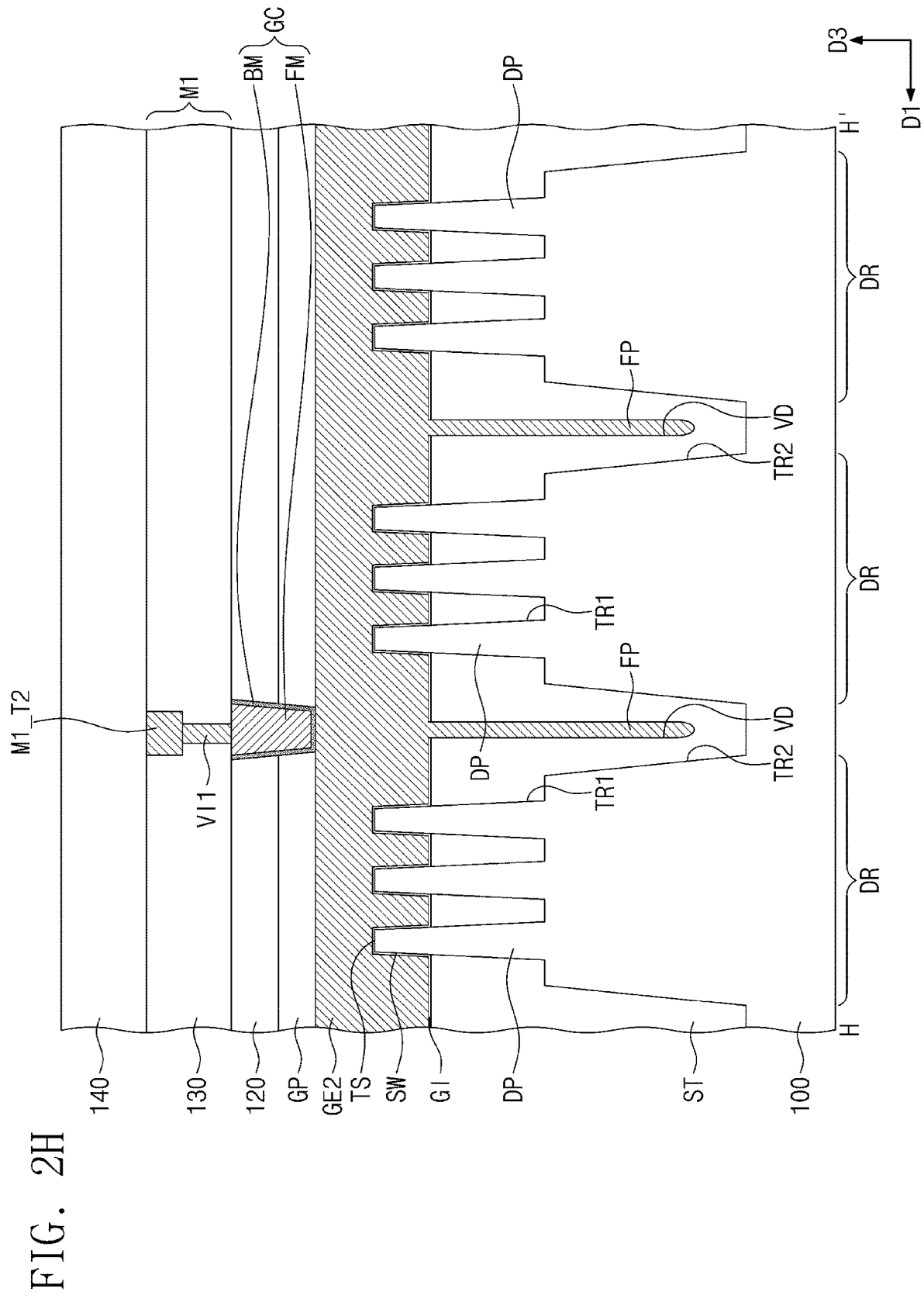

Referring to FIGS. 2F and 2G, the upper insulating pattern UIP may be provided to fill an empty region, which is located on each of the contact patterns CP adjacent to the second gate electrode GE2. Accordingly, it may be possible to prevent the contact pattern CP from being in contact with the second gate electrode GE2 adjacent thereto or to prevent a short circuit from being formed between the contact pattern CP and the second gate electrode GE2.

The first metal layer M1 may include a first test line M1_T1 and a second test line M1_T2, on the test region TSR. The first and second test lines M1_T1 and M1_T2 may be extended in the second direction D2 to be parallel to each other. The second test line M1_T2 may be coupled to the gate contact GC on the test region TSR. The first test line M1_T1 may be coupled to the contact pattern CP, which is adjacent to the second gate electrode GE2 electrically connected to the gate contact GC.

The top surface of the device isolation layer ST on the test region TSR may be flat. For example, the top surface of the device isolation layer ST on the test region TSR may not have an uneven portion that is similar to the recess region RSR on the logic cell region LCR.

The device isolation layer ST may include the void VD, which is vertically extended into one of the second trenches TR2. When viewed in a plan view, the void VD may be extended in the second direction D2. The void VD may be an empty space, which is extended from the top surface of the device isolation layer ST toward the bottom surface of the second trench TR2. The void VD may be provided in the second trench TR2. Unlike the illustrated structure, the void VD may not be provided in the second trench TR2 (e.g., see FIG. 1).

The gapfill pattern FP may be provided in the void VD. The gapfill pattern FP may be provided to fully fill the void VD. In some embodiments, the gapfill pattern FP may be provided to partially fill the void VD. As will be described below, the gapfill pattern FP may be formed by filling the void VD with a metallic material which is used in a process of forming the second gate electrode GE2 or the contact patterns CP.

The gapfill pattern FP may be formed of or may include at least one of metallic materials. In some embodiments, the gapfill pattern FP may include or may be a metal nitride layer. For example, the gapfill pattern FP may include or may be formed of nitrogen (N) and at least one metallic element, which is selected from the group consisting of titanium (Ti), tantalum (Ta), aluminum (Al), tungsten (W) and molybdenum (Mo). The gapfill pattern FP may further contain carbon (C). In some embodiments, the gapfill pattern FP may be formed of or may include at least one metallic material selected from the group consisting of tungsten (W), aluminum (Al), titanium (Ti), and tantalum (Ta).

A portion of the second gate electrode GE2 may be extended into the void VD. The gapfill pattern FP may include a portion of the second gate electrode GE2. Although not shown, a portion of the gate dielectric pattern GI may also be extended into the void VD. In some embodiments, the gapfill pattern FP may be formed of or may include the same material as the barrier pattern BM or the conductive pattern FM. If the protruding portion PT of the contact pattern CP is in contact with the gapfill pattern FP, the gapfill pattern FP may cause a short circuit issue between the contact pattern CP and the second gate electrode GE2 adjacent thereto. In some embodiments, to avoid such a short circuit issue between the contact pattern CP and the second gate electrode GE2, the protruding portion PT of the contact pattern CP may be spaced apart from the gapfill pattern FP so that the short circuit issue between the contact pattern CP and the second gate electrode GE2 adjacent thereto may not occur.

The first via VI1 may be interposed between the first test line M1_T1 and the contact pattern CP and between the second test line M1_T2 and the second gate electrode GE2. The first via VI1 between the first test line M1_T1 and the contact pattern CP may vertically overlap one of the dummy regions DR.

The second metal layer M2 may be spaced apart from the first and second test lines M1_T1 and M1_T2. The second metal layer M2 is horizontally offset from the test region TSR. The second metal layer M2 is not connected with the first and second test line M1_T1 and M1_T2. The second metal layer M2 may be provided on only the logic cell region LCR and may not be provided on the test region TSR.

The lowermost level of a top surface of each of the first and second active patterns AP1 and AP2 may be a first level LV1. The lowermost level of a bottom surface of the first interlayer insulating layer 110 on the logic cell region LCR may be a third level LV3 (e.g., see FIGS. 2C and 2D). The lowermost level of a top surface of each of the dummy patterns DP may be a second level LV2. The lowermost level of a bottom surface of the first interlayer insulating layer 110 on the test region TSR may be a fourth level LV4 (e.g., see FIG. 2G). The first level LV1 may be lower than the second level LV2. The third level LV3 may be lower than the fourth level LV4. This is because the first and second source/drain patterns SD1 and SD2 are not formed on the test region TSR, as will be described below. In some embodiments, the first and second source/drain patterns SD1 and SD2 may be formed on the first and second active patterns AP1 and AP2, respectively, and upper portions of the first and second active patterns AP1 and AP2 may be consumed in the formation of the first and second source/drain patterns SD1 and SD2. Such consumption of the first and second active patterns AP1 and AP2 may lower top surfaces below the top surfaces of the dummy patterns DP. In some embodiments, the top surfaces of the first and second active patterns AP1 and AP2 may be lower than the top surfaces of the dummy patterns DP.

The first and second test lines M1_T1 and M1_T2 may be applied with different voltages. A breakdown voltage may be measured by gradually increasing a difference between the voltages applied to the first and second test lines M1_T1 and M1_T2 until an insulating material between the contact pattern CP and the second gate electrode GE2 is broken. The shortest distance between the contact pattern CP and the second gate electrode GE2 may be quantitatively estimated, based on the measured value of the breakdown voltage. If a short circuit is formed between the contact pattern CP and the second gate electrode GE2 as illustrated (see FIG. 1), the breakdown voltage may be measured as zero. If, unlike the illustrated structure, a short circuit is not formed between the contact pattern CP and the second gate electrode GE2, a distance therebetween may be quantitatively estimated from the measured value of the breakdown voltage. This may make it possible to detect a short circuit failure, which may be caused by the void VD and the gapfill pattern FP in the logic cell region LCR having substantially the same structure as the test region TSR, in a non-destructive manner.

A destructive analysis method is used to identify whether there is a short circuit between a gate electrode and an active contact. For example, a failure (e.g., short circuit) may be examined, and then, an electron beam inspection and a nano probing technique may be used to analyze the position and type of the failure in a destructive manner (e.g., cutting a chip region at the examined position). According to an embodiment of the inventive concept, by applying different voltages to the first and second test lines M1_T1 and M1_T2 and gradually increasing the voltage difference in a voltage ramping manner, it may be possible to analyze a short-circuit failure in a non-destructive manner. Accordingly, it may be possible to reduce the time taken to detect or analyze a short-circuit failure caused by a void in a device isolation layer. Furthermore, since it is possible to prevent loss of a wafer that is caused when the analysis process is executed in a destructive manner, the cost for the analysis process can be reduced. As a result, it is possible to analyze a failure in a semiconductor device in a cost-effective and easier manner.

Figure 3:
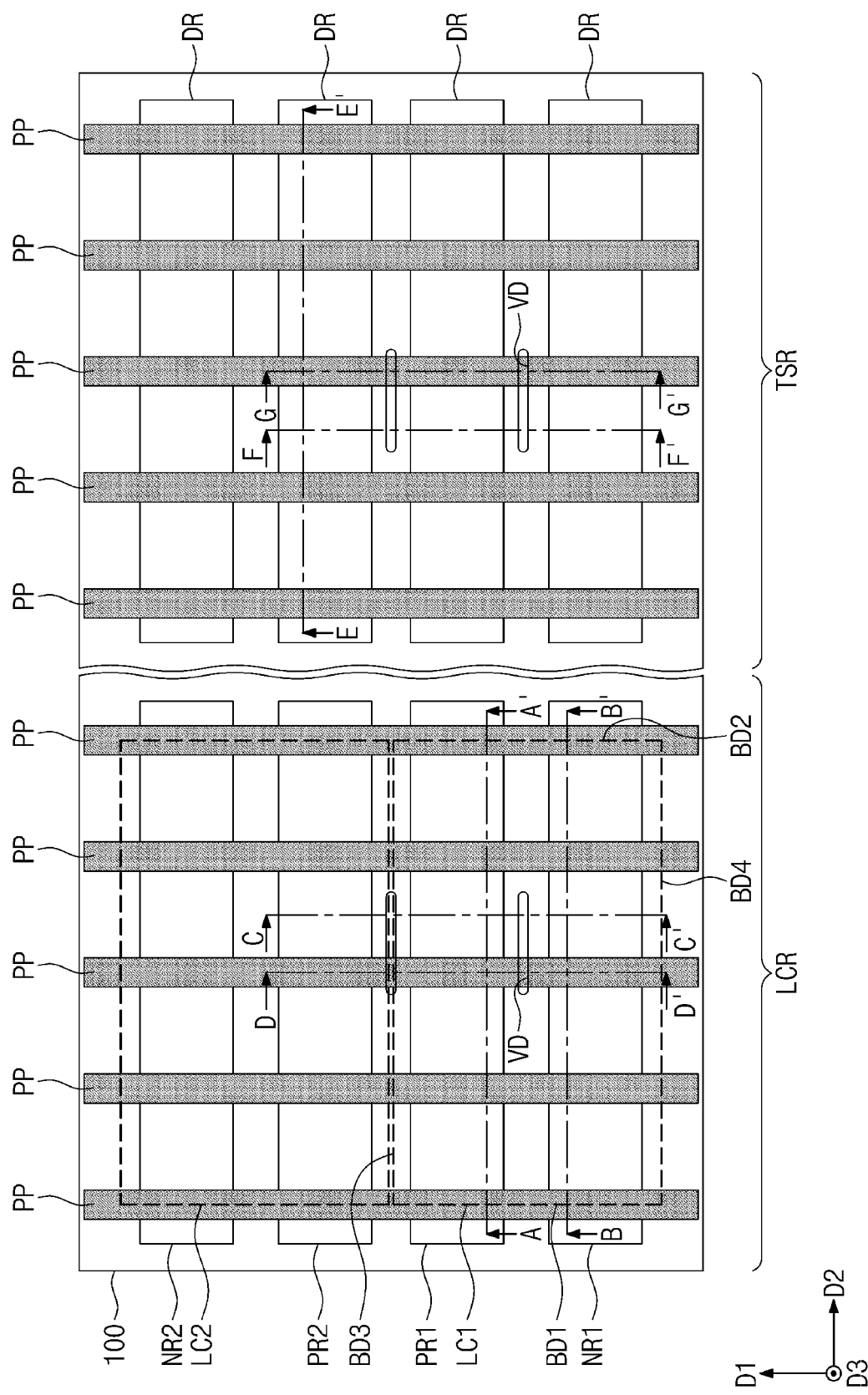
FIGS. 3 and 5 are plan views illustrating a method of fabricating a semiconductor device according to an embodiment of the inventive concept.
Figure 4A:
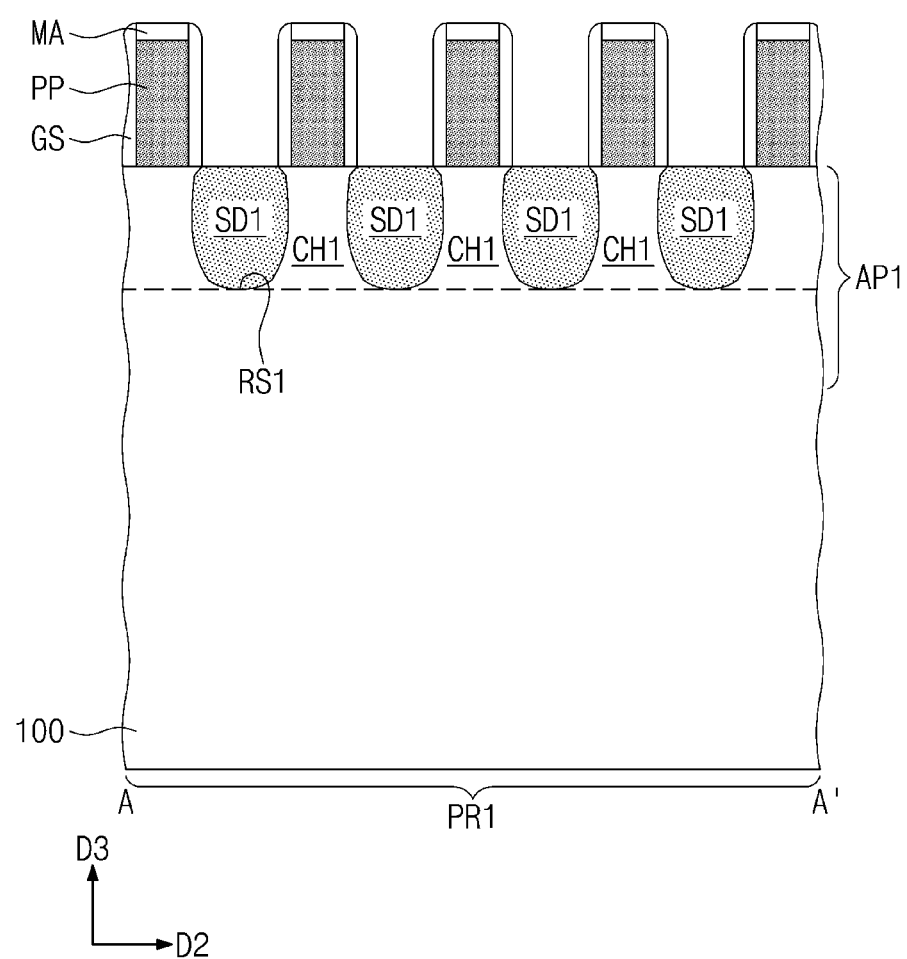
FIGS. 4A to 4G are sectional views, which are respectively taken along lines A-A', B-B', C-C', D-D', E-E', F-F', and G-G' of FIG. 3.
Figure 4B:
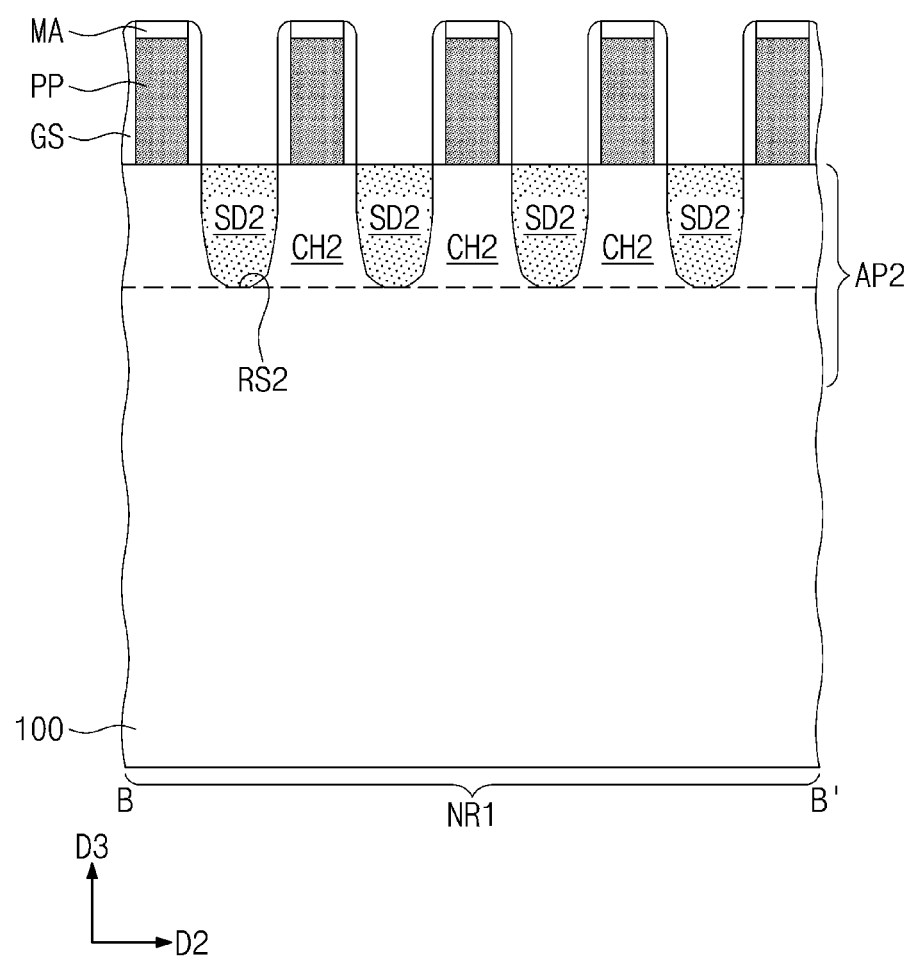
Figure 4C:
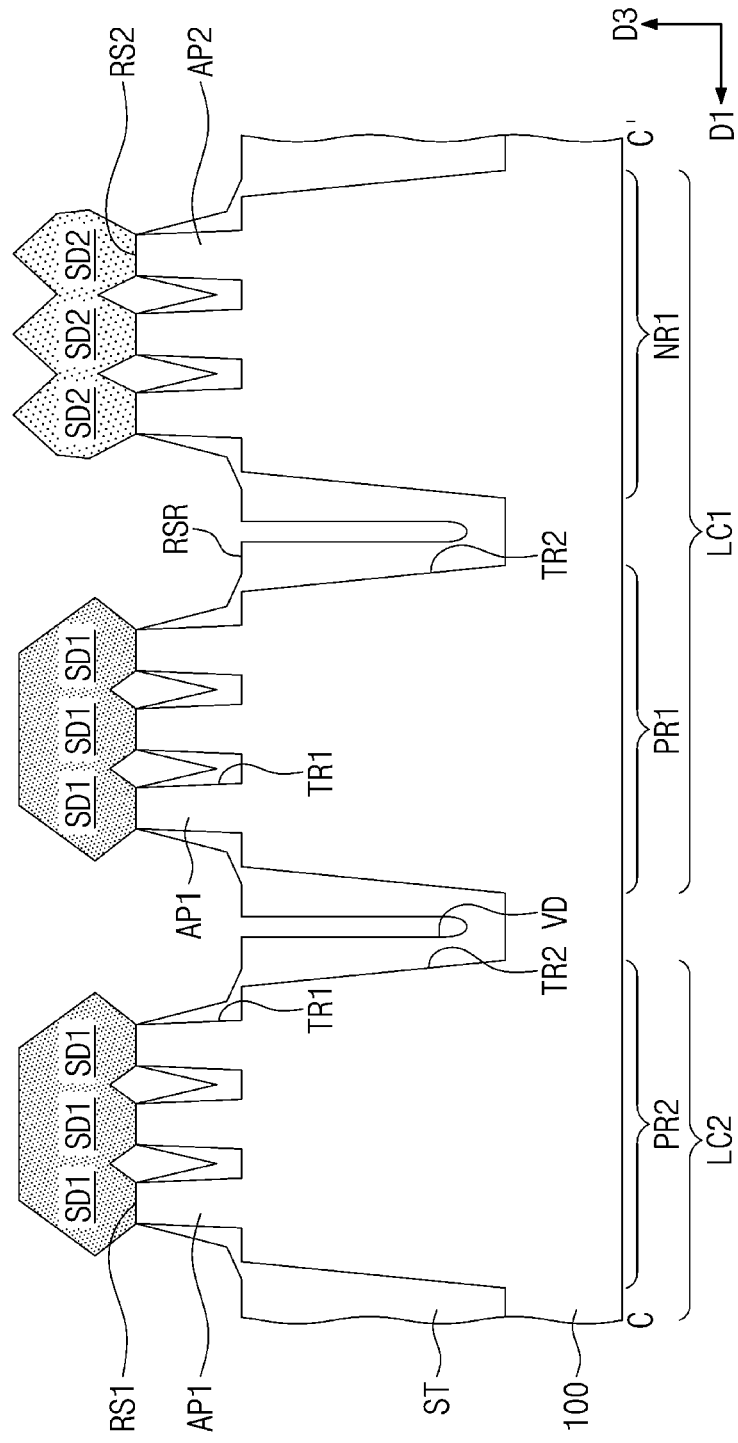
Figure 4D:
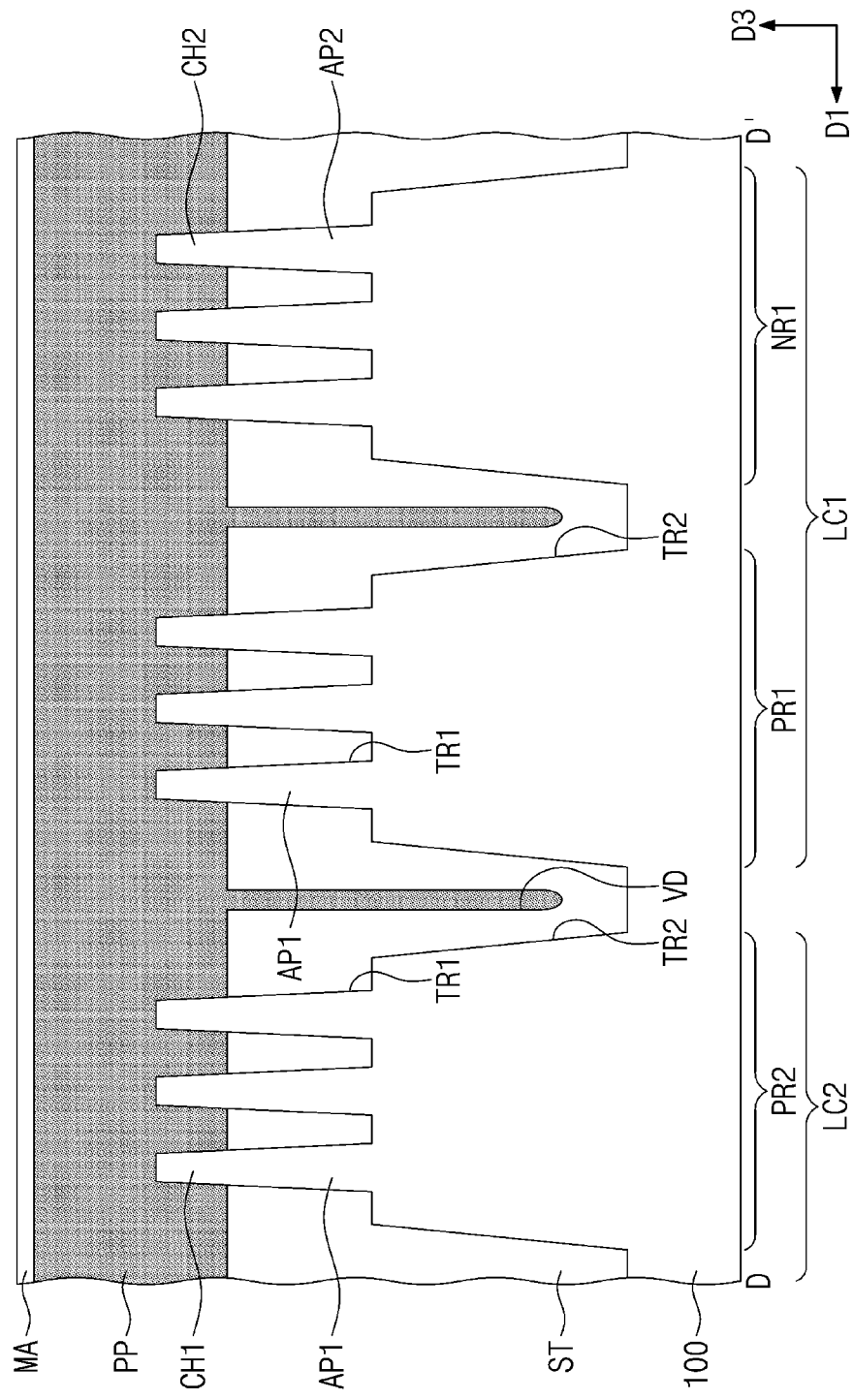
Figure 4E:
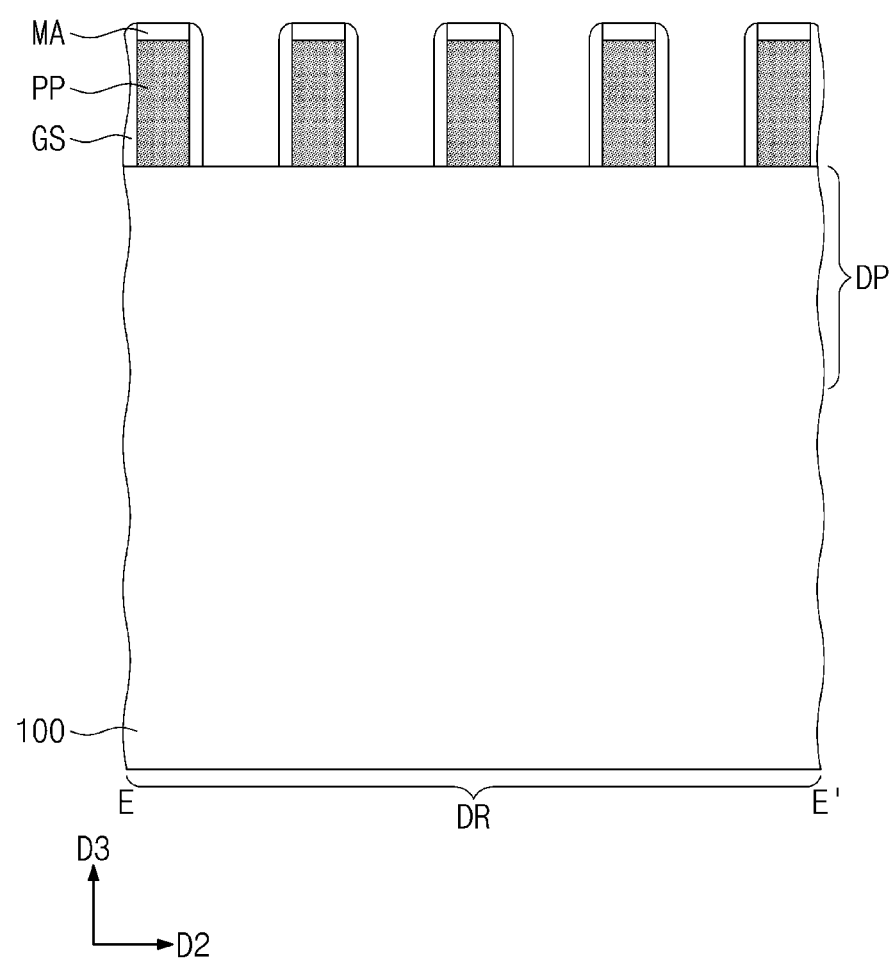
Figure 4F:
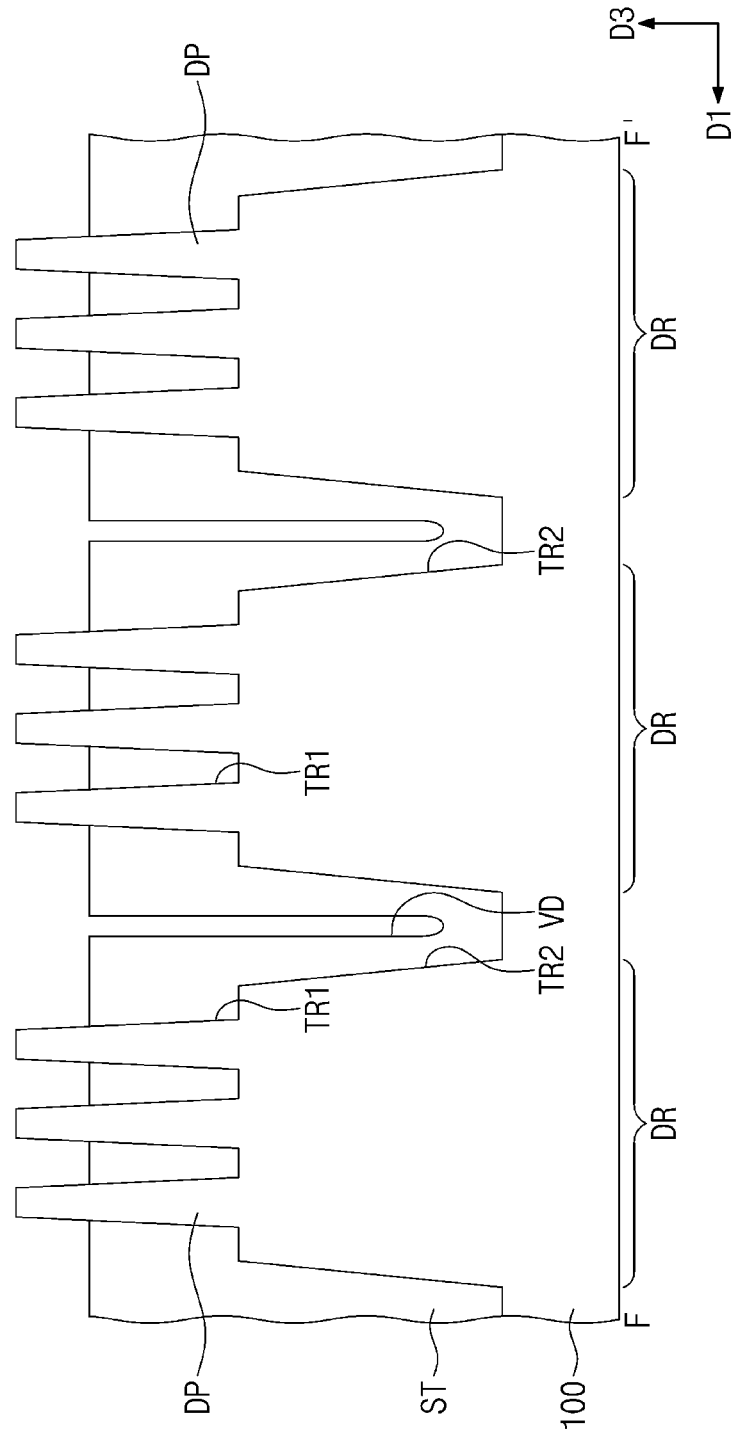
Figure 4G:
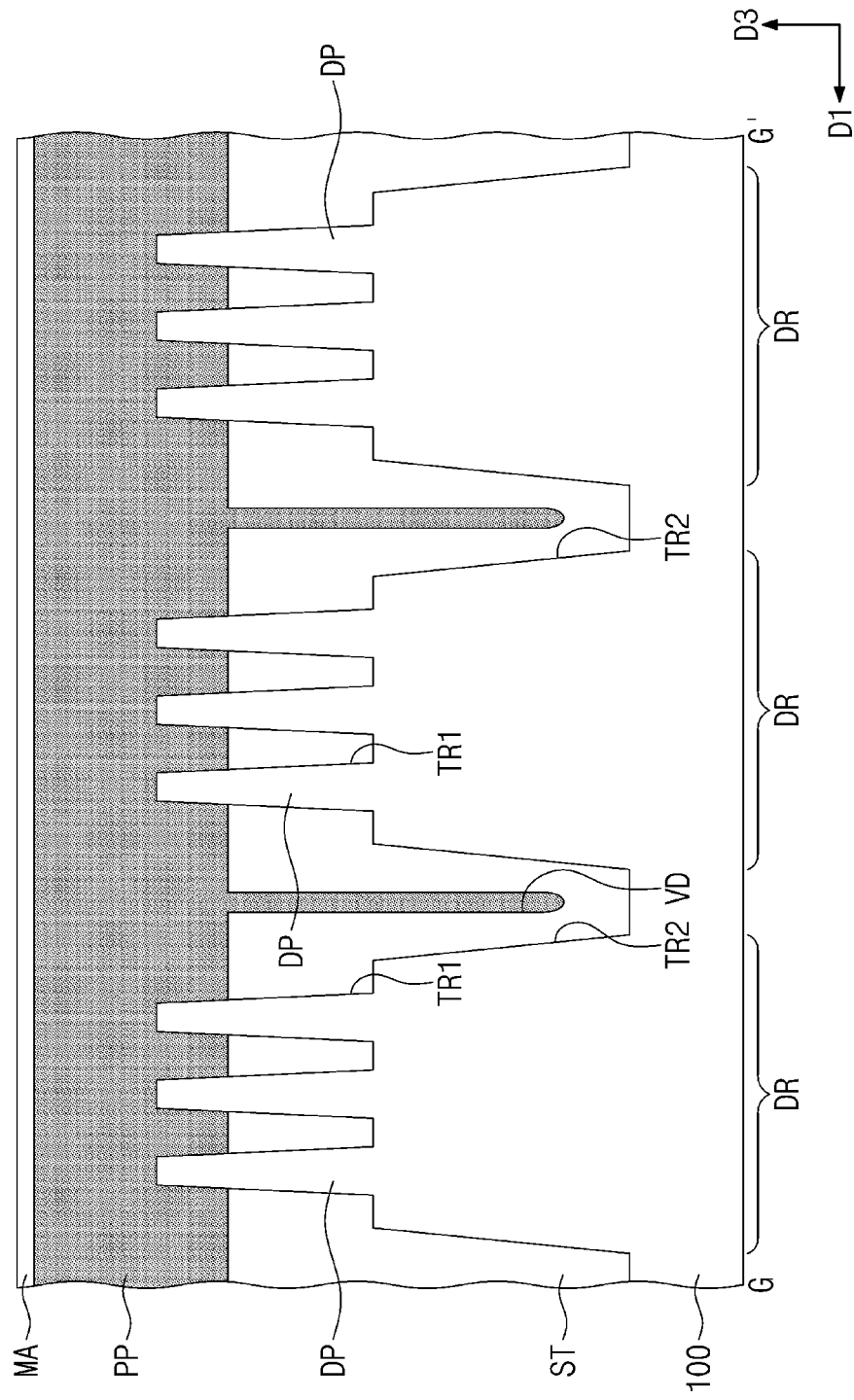
Figure 5:
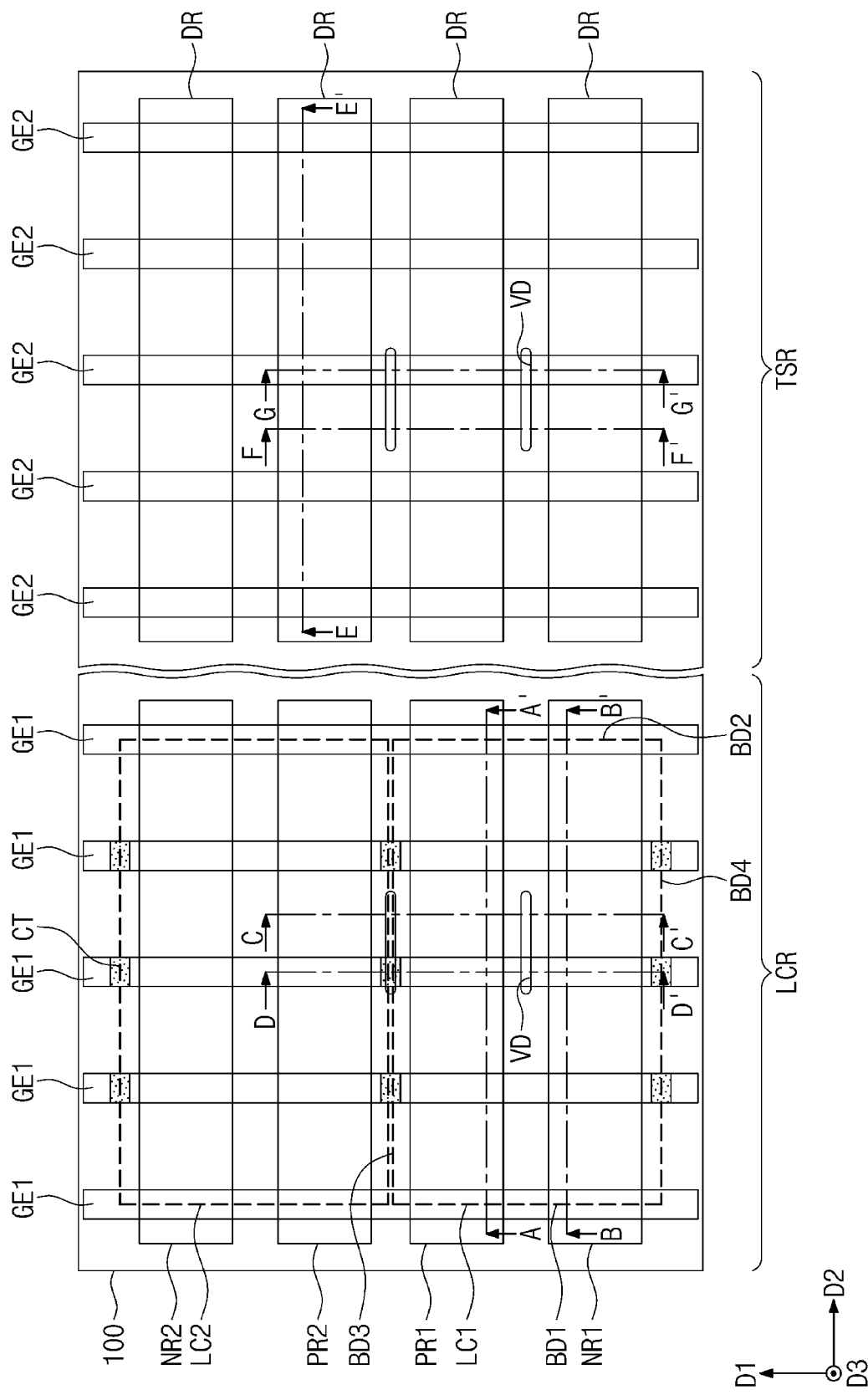
Figure 6A:
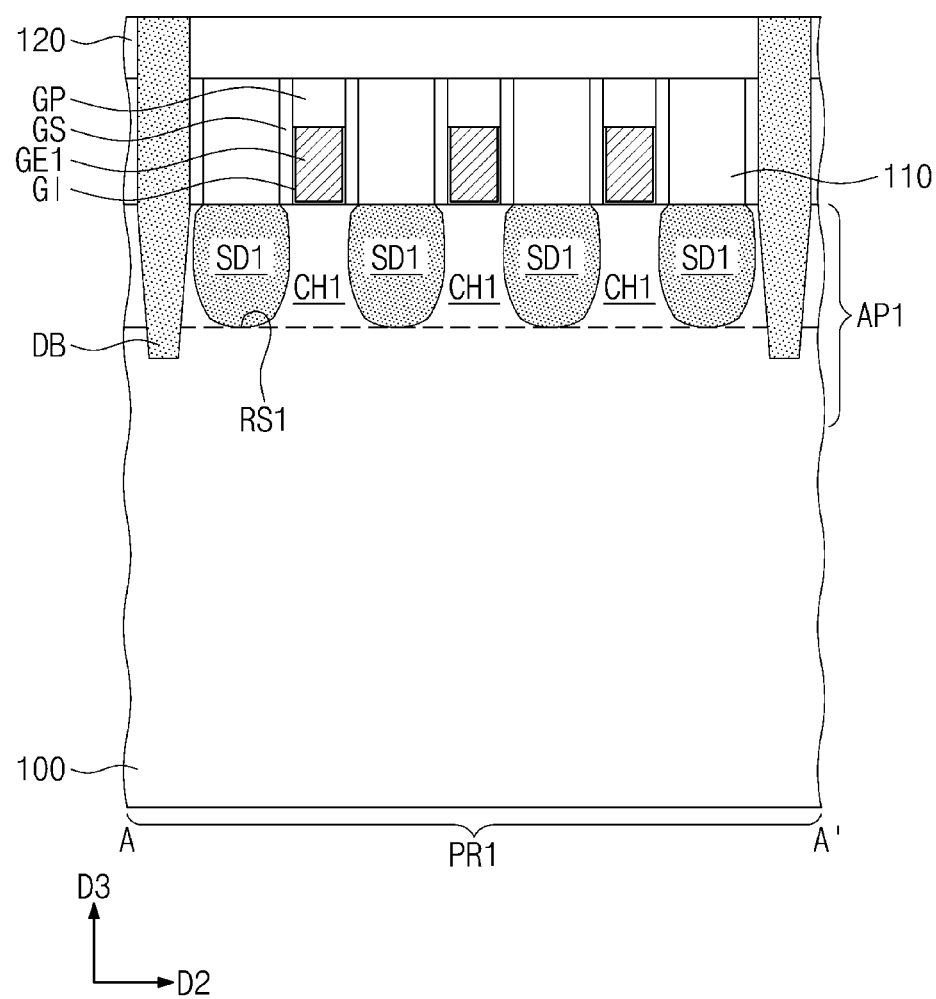
FIGS. 6A to 6G are sectional views, which are respectively taken along lines A-A', B-B', C-C', D-D', E-E', F-F', and G-G' of FIG. 5.
Figure 6B:
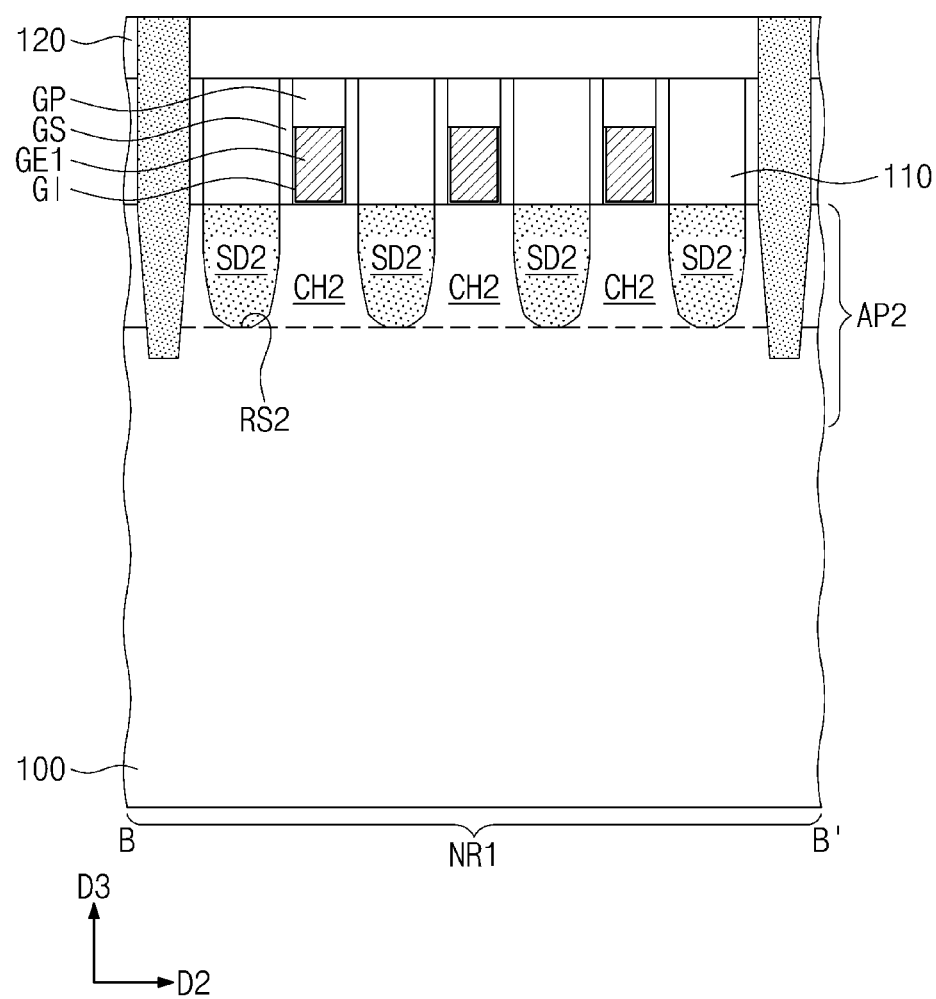
Figure 6C:
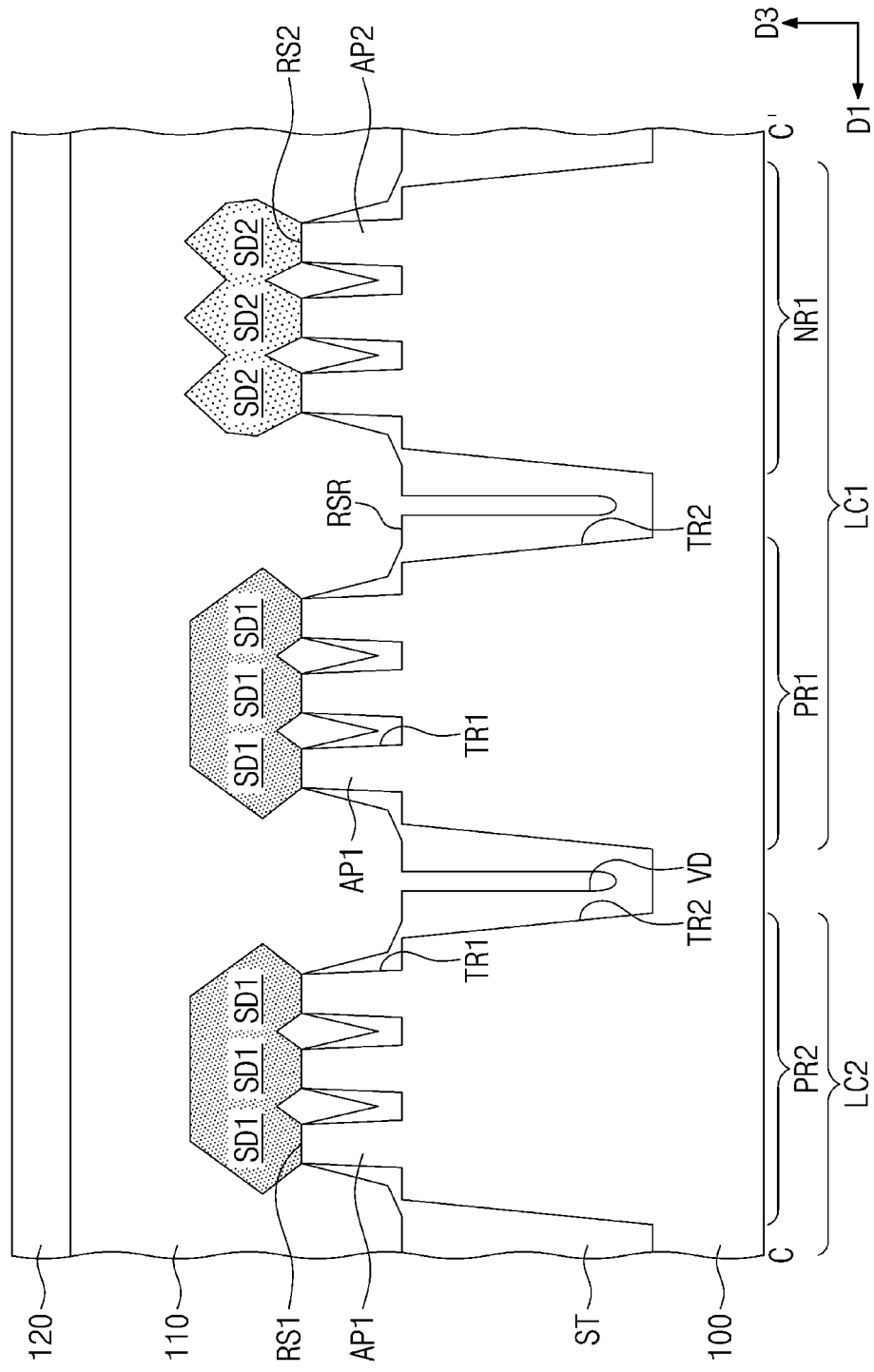
Figure 6D:
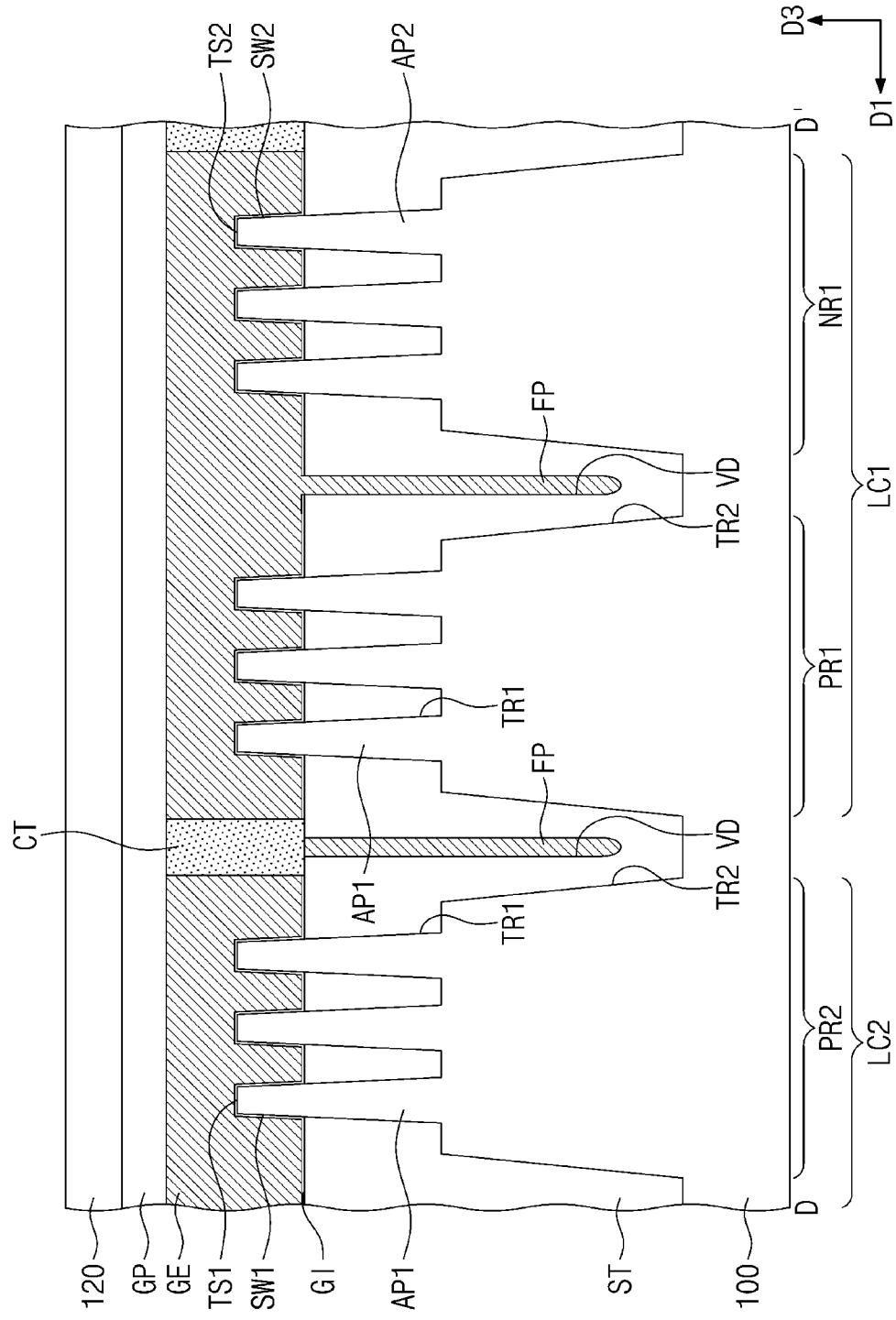
Figure 6E:
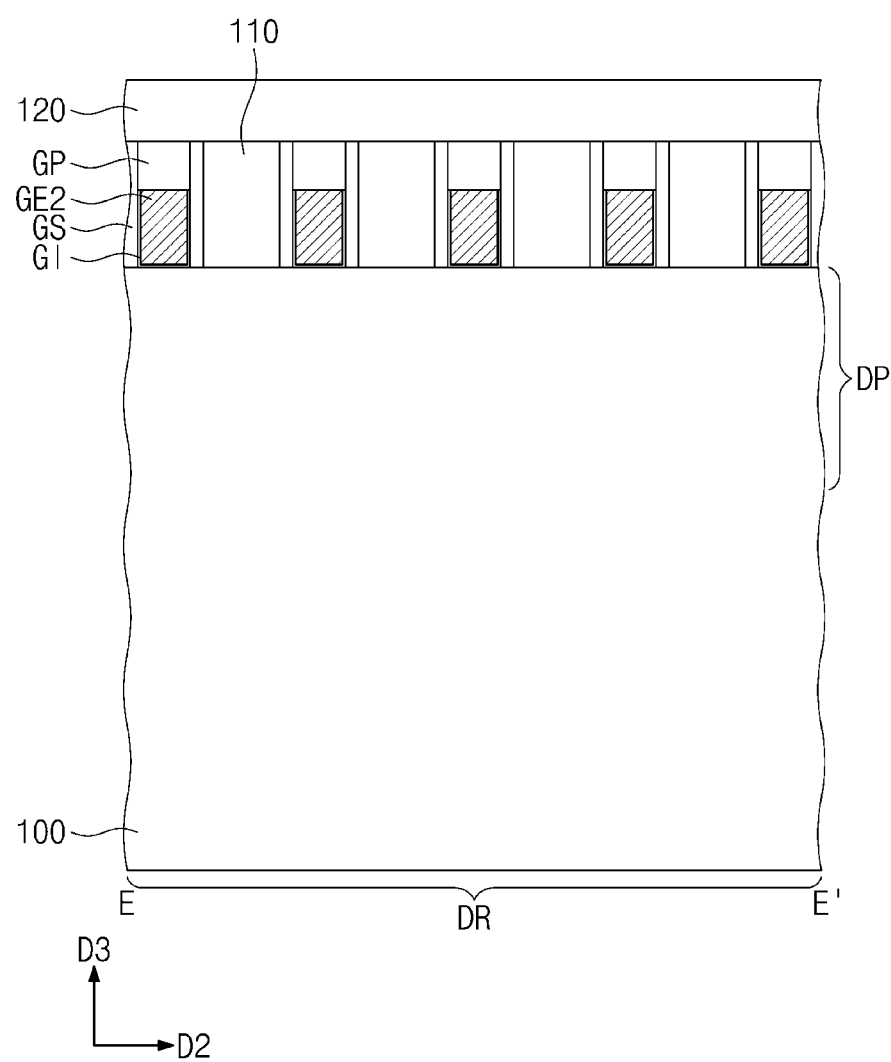
Figure 6F:
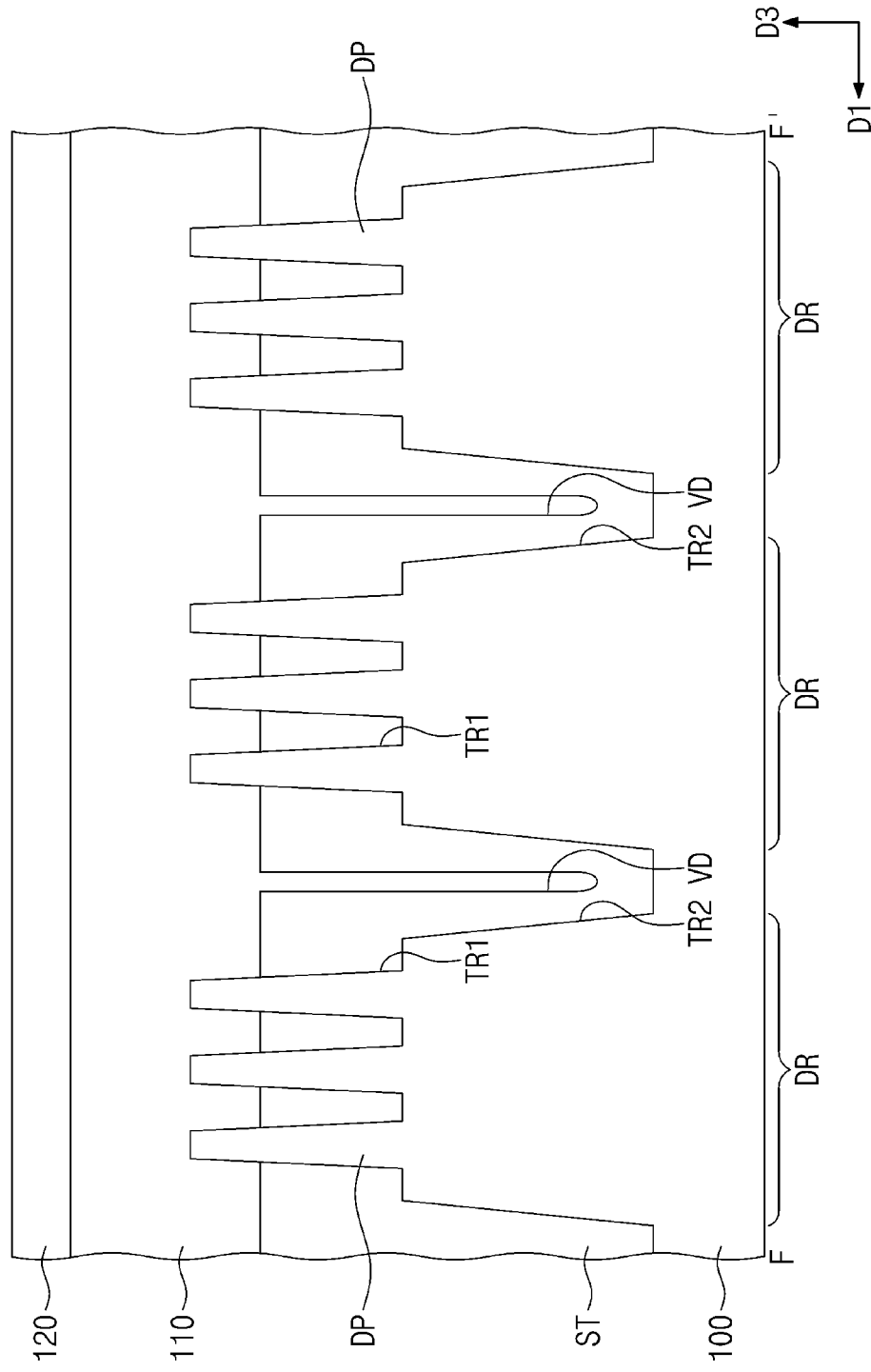
Figure 6G:
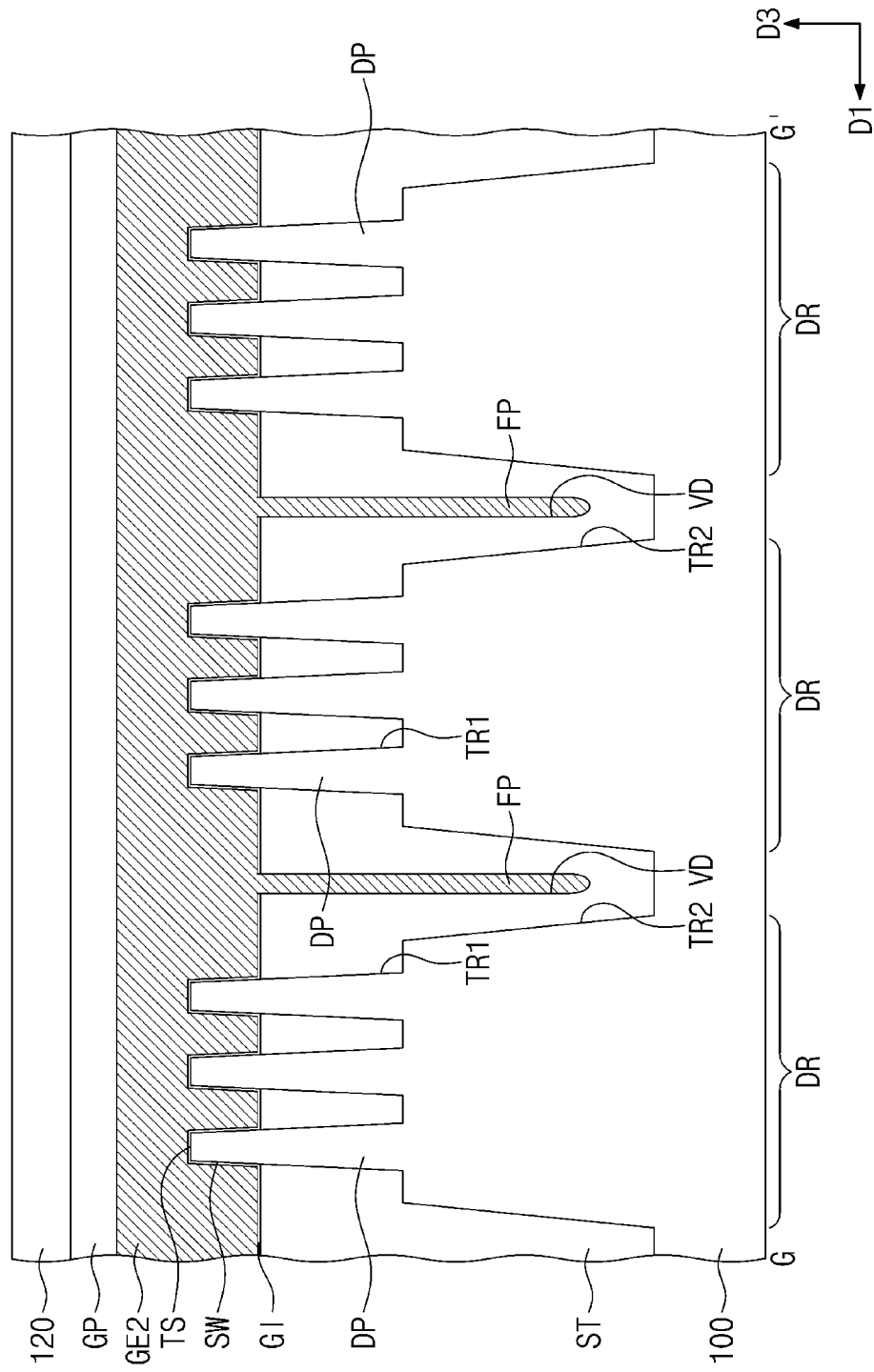

FIGS. 3 and 5 are plan views illustrating a method of fabricating a semiconductor device according to an embodiment of the inventive concept. FIGS. 4A to 4G are sectional views, which are respectively taken along lines A-A', B-B', C-C', D-D', E-E', F-F', and G-G' of FIG. 3. FIGS. 6A to 6G are sectional views, which are respectively taken along lines A-A', B-B', C-C', D-D', E-E', F-F', and G-G' of FIG. 5.

Referring to FIGS. 3 and 4A to 4G, the substrate 100 with the logic cell region LCR and the test region TSR may be provided. The logic cell region LCR may include the active regions PR1, PR2, NR1, and NR2. The active regions PR1, PR2, NR1, and NR2 may include the first PMOSFET region PR1, the second PMOSFET region PR2, the first NMOSFET region NR1, and the second NMOSFET region NR2. The test region TSR may include the dummy regions DR. The active regions PR1, PR2, NR1, and NR2 and the dummy regions DR may be defined by the second trenches TR2.

The substrate 100 may be patterned to form the first and second active patterns AP1 and AP2. The first active patterns AP1 may be formed on each of the first and second PMOSFET regions PR1 and PR2. The second active patterns AP2 may be formed on each of the first and second NMOSFET regions NR1 and NR2. The dummy patterns DP may be formed on each of the dummy regions DR. The first and second active patterns AP1 and AP2 and the dummy patterns DP may be defined by the first trenches TR1.

The device isolation layer ST may be formed on the substrate 100. The device isolation layer ST may be formed of or may include an insulating material (e.g., silicon oxide layer). The device isolation layer ST may be formed to fill the first and second trenches TR1 and TR2. The void VD may be formed in the device isolation layer ST. The void VD may be formed in the deep trench (i.e., the second trench TR2). This is because the second trench TR2 has a width smaller than a depth (i.e., a high aspect ratio), and thus is not fully filled with the device isolation layer ST.

The device isolation layer ST may be recessed to expose an upper portion of each of the first and second active patterns AP1 and AP2 and the dummy patterns DP. Accordingly, the upper portion of each of the first and second active patterns AP1 and AP2 and the dummy patterns DP may vertically protrude above the device isolation layer ST.

Sacrificial patterns PP may be formed to cross the first and second active patterns AP1 and AP2 and the dummy patterns DP. The sacrificial patterns PP may be formed to have a line or bar shape extending in the first direction D1. The sacrificial pattern PP may be formed to fill the void VD. However, unlike the illustrated structure, the sacrificial pattern PP may partially fill the void VD or may not fill the void VD.

The formation of the sacrificial patterns PP may include forming a sacrificial layer on the substrate 100, forming mask patterns MA on the sacrificial layer, and patterning the sacrificial layer using the mask patterns MA as an etch mask. The sacrificial layer may be formed of or may include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer layer may be formed of or may include at least one of SiCN, SiCON, and SiN. In some embodiments, the gate spacer layer may be a multi-layered structure that includes at least two layers, each of which is formed of at least one of SiCN, SiCON, and SiN.

The first source/drain patterns SD1 may be formed in an upper portion of each of the first active patterns AP1. A pair of the first source/drain patterns SD1 may be formed at opposite sides of each of the sacrificial patterns PP.

First recesses RS1 may be formed by etching an upper portion of the first active pattern AP1 using the mask patterns MA and the gate spacers GS as an etch mask. The device isolation layer ST between the first active patterns AP1 may be recessed during the etching of the upper portion of the first active pattern AP1 (e.g., see FIG. 4C). Accordingly, the recess region RSR may be formed to be recessed from the top surface of the device isolation layer ST on the logic cell region LCR toward one of the second trenches TR2.

The first source/drain pattern SD1 may be formed by a selective epitaxial growth process using an inner surface of the first recess RS1 of the first active pattern AP1 as a seed layer. As a result of the formation of the first source/drain patterns SD1, the first channel pattern CH1 may be defined between a pair of the first source/drain patterns SD1. In some embodiments, the selective epitaxial growth process may include a chemical vapor deposition (CVD) process or a molecular beam epitaxy (MBE) process. The first source/drain patterns SD1 may be formed of or may include a semiconductor material (e.g., SiGe) having a lattice constant greater than a lattice constant of the substrate 100. Each of the first source/drain patterns SD1 may be a multi-layered structure including a plurality of semiconductor layers.

In some embodiments, the first source/drain patterns SD1 may be doped with impurities in situ during the selective epitaxial growth process for forming the first source/drain patterns SD1. In another embodiment, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed in an upper portion of the second active pattern AP2. A pair of the second source/drain patterns SD2 may be formed at opposite sides of each of the sacrificial patterns PP.

Second recesses RS2 may be formed by etching an upper portion of the second active pattern AP2 using the mask patterns MA and the gate spacers GS as an etch mask. The second source/drain pattern SD2 may be formed by a selective epitaxial growth process using an inner surface of the second recess RS2 of the second active pattern AP2 as a seed layer. As a result of the formation of the second source/drain patterns SD2, the second channel pattern CH2 may be defined between a pair of the second source/drain patterns SD2. The second source/drain patterns SD2 may be formed of or may include the same semiconductor material (e.g., Si) as the substrate 100. The second source/drain patterns SD2 may be doped to have a second conductivity type (e.g., n-type).

The first and second source/drain patterns SD1 and SD2 may be sequentially formed through different processes. For example, the first and second source/drain patterns SD1 and SD2 may not be formed at the same time.

A mask layer (not shown) may be provided to cover the test region TSR, before the process of forming the first and second source/drain patterns SD1 and SD2. In this case, the first and second source/drain patterns SD1 and SD2 may not be formed on the test region TSR. Since a process of recessing an upper portion of the dummy pattern DP is not performed, the top surface of the device isolation layer ST on the test region TSR may have a flat profile.

Referring to FIGS. 5 and 6A to 6G, the first interlayer insulating layer 110 may be formed to cover the first and second source/drain patterns SD1 and SD2, the mask patterns MA, and the gate spacers GS. In some embodiments, the first interlayer insulating layer 110 may include or may be a silicon oxide layer.

The first interlayer insulating layer 110 may be planarized to expose the top surfaces of the sacrificial patterns PP. The planarization of the first interlayer insulating layer 110 may be performed using an etch-back or chemical mechanical polishing (CMP) process. In some embodiments, the mask patterns MA may be fully removed during the planarization process. As a result, the first interlayer insulating layer 110 may have a top surface that is coplanar with the top surfaces of the sacrificial patterns PP and the top surfaces of the gate spacers GS.

The sacrificial patterns PP may be respectively replaced with the first and second gate electrodes GE1 and GE2. For example, the exposed sacrificial patterns PP may be selectively removed. As a result of the removal of the sacrificial patterns PP, empty spaces may be formed. The gate dielectric pattern GI, the first or second gate electrode GE1 or GE2, and the gate capping pattern GP may be formed in each of the empty spaces. Each of the first and second gate electrodes GE1 and GE2 may include a first metal pattern and a second metal pattern on the first metal pattern. The first metal pattern may be formed of a work function metal, which is used to adjust a threshold voltage of a transistor, and the second metal pattern may be formed of a metallic material having a low resistance.

During the replacing of the sacrificial pattern PP with the first gate electrode GE1, the gate cutting patterns CT may be formed on the first gate electrode GE1. The gate cutting patterns CT may divide each first gate electrode GE1 into a plurality of first gate electrodes GE1, which are separated from each other. The gate cutting pattern CT may not be formed on the test region TSR.

During the replacing of the sacrificial pattern PP with the first and second gate electrodes GE1 and GE2, the gapfill pattern FP may be formed in the void VD. For example, at least a portion of the void VD may be filled with a metallic material constituting the first and second gate electrodes GE1 and GE2.

The second interlayer insulating layer 120 may be formed on the first interlayer insulating layer 110. The second interlayer insulating layer 120 may include or may be a silicon oxide layer. A pair of the division structures DB may be respectively formed at opposite sides of the first logic cell LC1. The division structures DB may overlap the first gate electrodes GE1, and may be respectively formed at opposite sides of the first logic cell LC1. For example, the formation of the division structures DB may include forming holes, which penetrate the first and second interlayer insulating layers 110 and 120 and the first gate electrode GE1 and are extended into the first and second active patterns AP1 and AP2, and then filling the holes with an insulating layer.

Referring to FIGS. 1 and 2A to 2H, a first hard mask pattern (not shown) may be formed on the second interlayer insulating layer 120. A photolithography process may be performed to form a plurality of openings in the first hard mask pattern. A first etching process may be performed on the substrate 100. The first etching process may be an anisotropic etching process. The first etching process may be performed to etch the second interlayer insulating layer 120 exposed through the openings. Furthermore, the first etching process may be performed to etch the first interlayer insulating layer 110 exposed through the openings. In some embodiments, the first etching process may be performed to expose the first and second source/drain patterns SD1 and SD2 on the logic cell region LCR. An upper portion of each of the first and second source/drain patterns SD1 and SD2 may be removed during the first etching process. The first etching process may be performed to expose the dummy patterns DP on the test region TSR. An upper portion of each of the dummy patterns DP and a portion of the device isolation layer ST may be removed during the first etching process.

The first interlayer insulating layer 110 between the first and second source/drain patterns SD1 and SD2 and between the dummy patterns DP may be deeply recessed during the first etching process.

The active contacts AC and the contact patterns CP may be formed by filling empty regions, which are formed by recessing the first and second interlayer insulating layers 110 and 120, with a conductive material. In some embodiments, each of the first and second active contacts AC1 and AC2 may include the first body portion BP1, the second body portion BP2, and the protruding portion PT between the first and second body portions BP1 and BP2. The contact pattern CP may include the body portions BP and the protruding portion PT therebetween. In some embodiments, when the active contacts AC and the contact patterns CP are formed, at least a portion of the barrier and conductive patterns BM and FM constituting them may be buried in the void VD to form a portion of the gapfill pattern FP.

A second hard mask pattern (not shown) may be formed on the second interlayer insulating layer 120. A second etching process may be performed using the second hard mask pattern. For example, the second etching process may be performed to etch upper portions of the active contact AC and the contact pattern CP, which are exposed by the second hard mask pattern. The upper insulating patterns UIP may be formed by filling the etched upper portions of the active contact AC and the contact pattern CP with an insulating material.

The gate contacts GC may be formed to penetrate the second interlayer insulating layer 120 and the gate capping pattern GP and may be electrically connected to the first and second gate electrodes GE1 and GE2, respectively.

The third interlayer insulating layer 130 may be formed on the second interlayer insulating layer 120. The first metal layer M1 may be formed in the third interlayer insulating layer 130. The formation of the first metal layer M1 may include forming the first power line M1_R1, the second power line M1_R2, the third power line M1_R3, and the first interconnection lines M1_I on the logic cell region LCR and forming the first and second test lines M1_T1 and M1_T2 on the test region TSR.

The fourth interlayer insulating layer 140 may be formed on the first metal layer M1. The second metal layer M2 may be formed in the fourth interlayer insulating layer 140. The formation of the second metal layer M2 may include forming the second interconnection lines M2_I. In some embodiments, the second interconnection lines M2_I may be formed by a dual damascene process.

Figure 7:
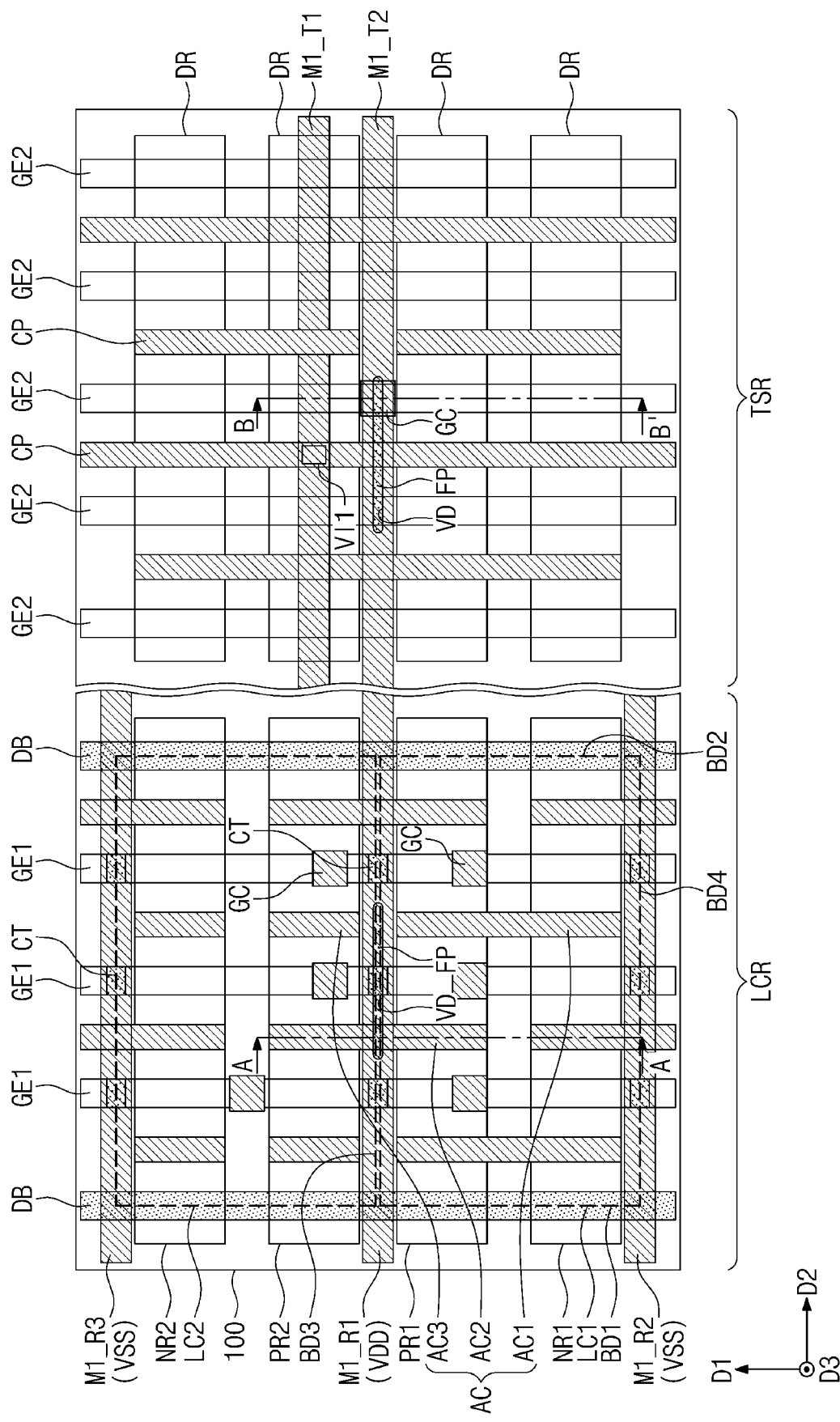
FIG. 7 is a plan view illustrating a semiconductor device according to an embodiment of the inventive concept.
Figure 8A:
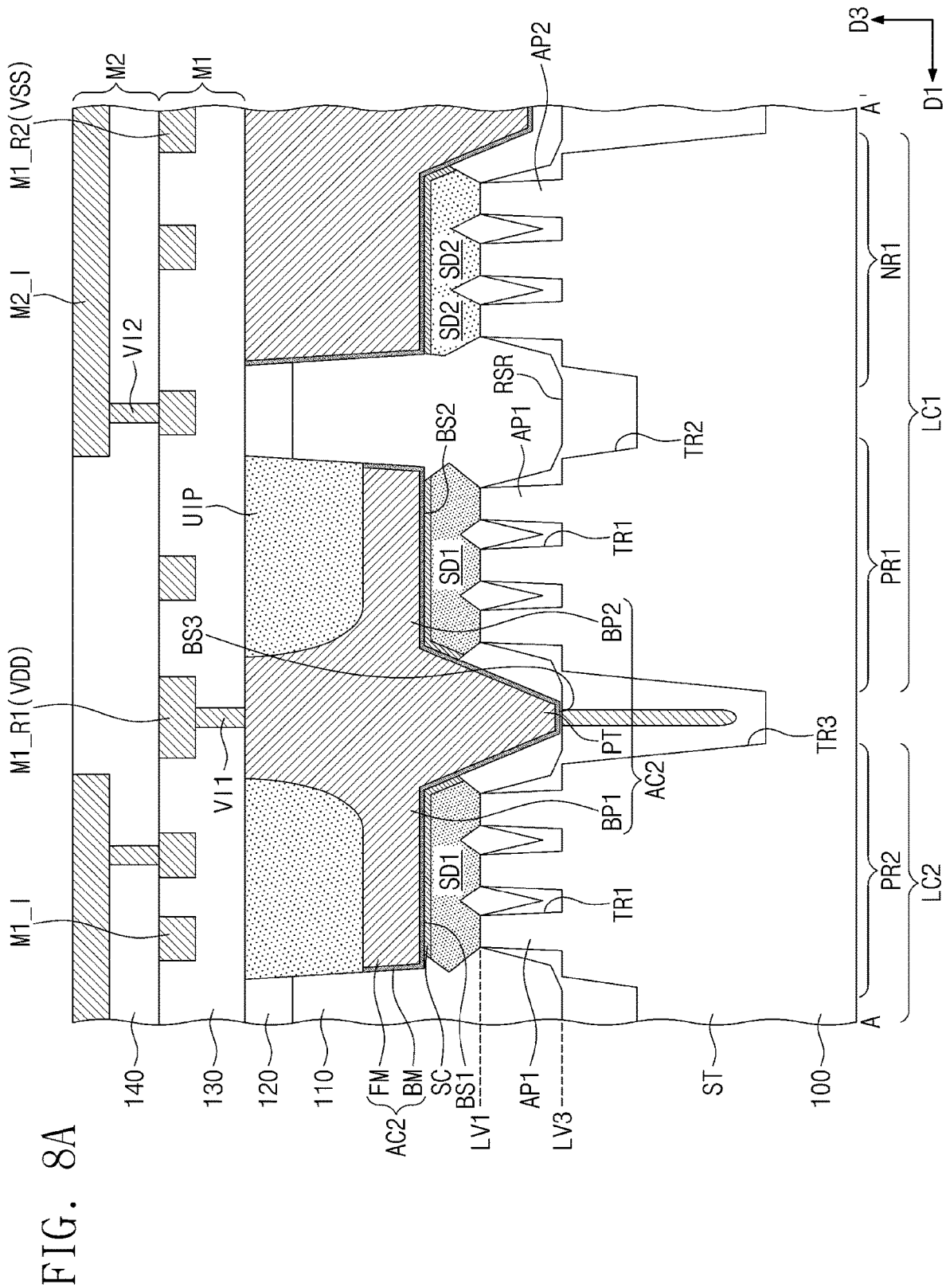
FIGS. 8A and 8B are sectional views taken along lines A-A' and B-B', respectively, of FIG. 7.
Figure 8B:
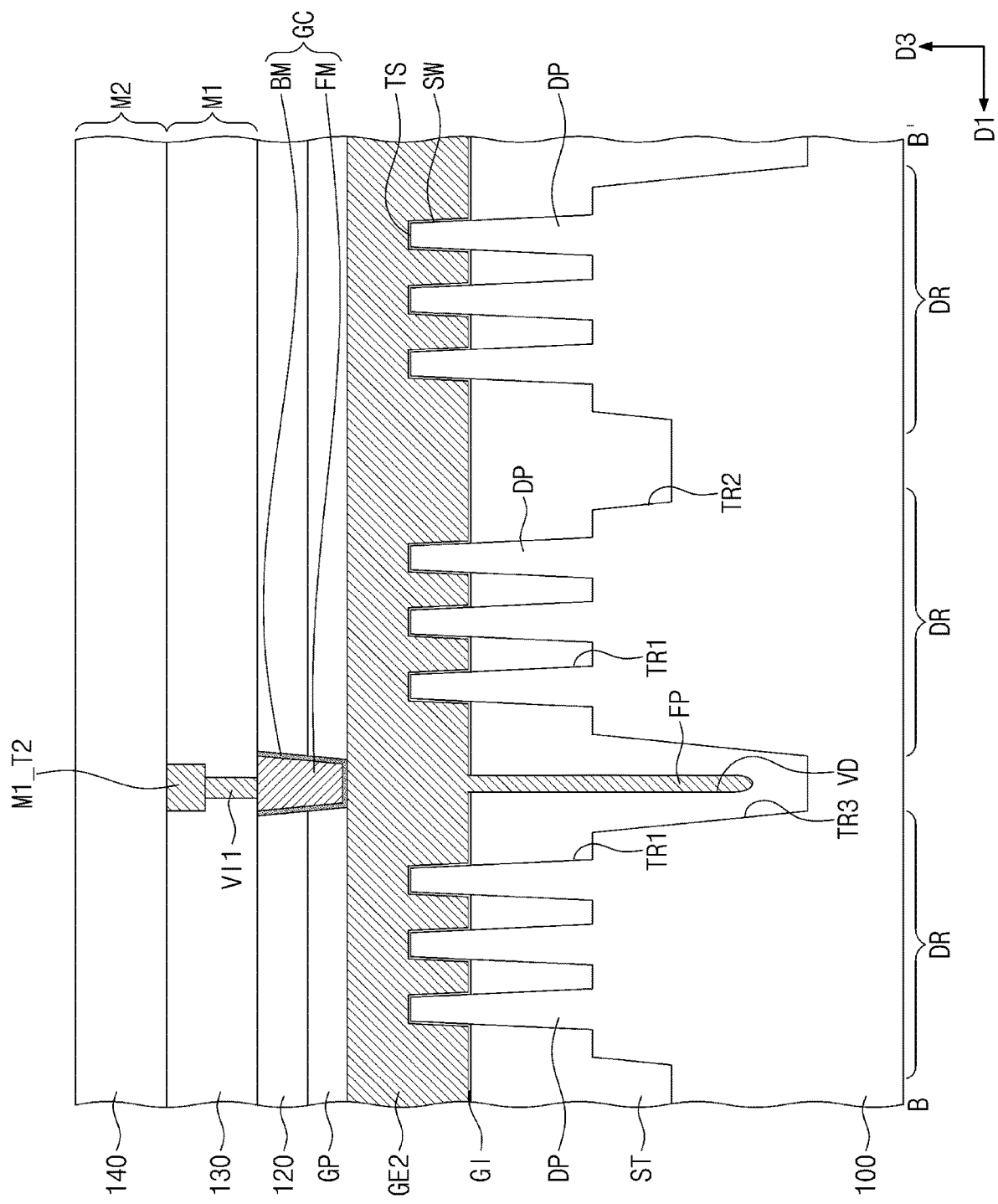

FIG. 7 is a plan view illustrating a semiconductor device according to an embodiment of the inventive concept. FIGS. 8A and 8B are sectional views taken along lines A-A' and B-B', respectively, of FIG. 7. For concise description, an element previously described with reference to FIGS. 1 and 2A to 2H may be identified by the same reference number without repeating an overlapping description thereof.

Referring to FIGS. 7, 8A, and 8B, the second trench TR2 may be formed between the first and second active patterns AP1 and AP2, which are adjacent to each other. A third trench TR3 may be formed between the first active patterns AP1, which are adjacent to each other. The first trench TR1 may be shallower than the second trench TR2. The second trench TR2 may be shallower than the third trench TR3. The third trench TR3 may be a deep trench.

The void VD may be formed in the third trench TR3 and may not be formed in the second trench TR2. This is because the third trench TR3 has a width smaller than a depth (i.e., has a high aspect ratio), and thus is not fully filled with the device isolation layer ST.

FIGS. 9A to 9D are sectional views, which are respectively taken along lines A-A', B-B', D-D', and E-E' of FIG. 1 to illustrate a semiconductor device according to an embodiment of the inventive concept. For concise description, an element previously described with reference to FIGS. 1 and 2A to 2H may be identified by the same reference number without repeating an overlapping description thereof.

Referring to FIGS. 1 and 9A to 9D, the substrate 100 including the logic cell region LCR and the test region TSR may be provided. The logic cell region LCR may include the first PMOSFET region PR1, the second PMOSFET region PR2, the first NMOSFET region NR1, and the second NMOSFET region NR2. The test region TSR may include the dummy regions DR.

The device isolation layer ST may be provided on the substrate 100. The device isolation layer ST may define the first and second active patterns AP1 and AP2 in an upper portion of the substrate 100. The first active pattern AP1 may be defined on each of the first PMOSFET region PR1 and the second PMOSFET region PR2, and the second active pattern AP2 may be defined on each of the first NMOSFET region NR1 and the second NMOSFET region NR2.

The first active pattern AP1 may include the first channel patterns CH1, which are vertically stacked on each other. The stacked first channel patterns CH1 may be spaced apart from each other in a third direction D3. The stacked first channel patterns CH1 may vertically overlap each other. The second active pattern AP2 may include second channel patterns CH2, which are vertically stacked on each other. The stacked second channel patterns CH2 may be spaced apart from each other in the third direction D3. The stacked second channel patterns CH2 may vertically overlap each other. The first and second channel patterns CH1 and CH2 may be formed of or may include at least one of silicon (Si), germanium (Ge), and silicon-germanium (SiGe).

The first active pattern AP1 may further include the first source/drain patterns SD1. The stacked first channel patterns CH1 may be interposed between a pair of the first source/drain patterns SD1, which are adjacent to each other. The stacked first channel patterns CH1 may connect the adjacent pair of the first source/drain patterns SD1 with each other.

The second active pattern AP2 may further include the second source/drain patterns SD2. The stacked second channel patterns CH2 may be interposed between a pair of the second source/drain patterns SD2, which are adjacent to each other. The stacked second channel patterns CH2 may connect the adjacent pair of the second source/drain patterns SD2 to each other.

The first gate electrodes GE1 may be provided to cross the first and second channel patterns CH1 and CH2 and to extend in the first direction D1. The first gate electrode GE1 may vertically overlap the first and second channel patterns CH1 and CH2. A pair of the gate spacers GS may be disposed on opposite side surfaces of the first gate electrode GE1. The gate capping pattern GP may be provided on the first gate electrode GE1.

Figure 9A:
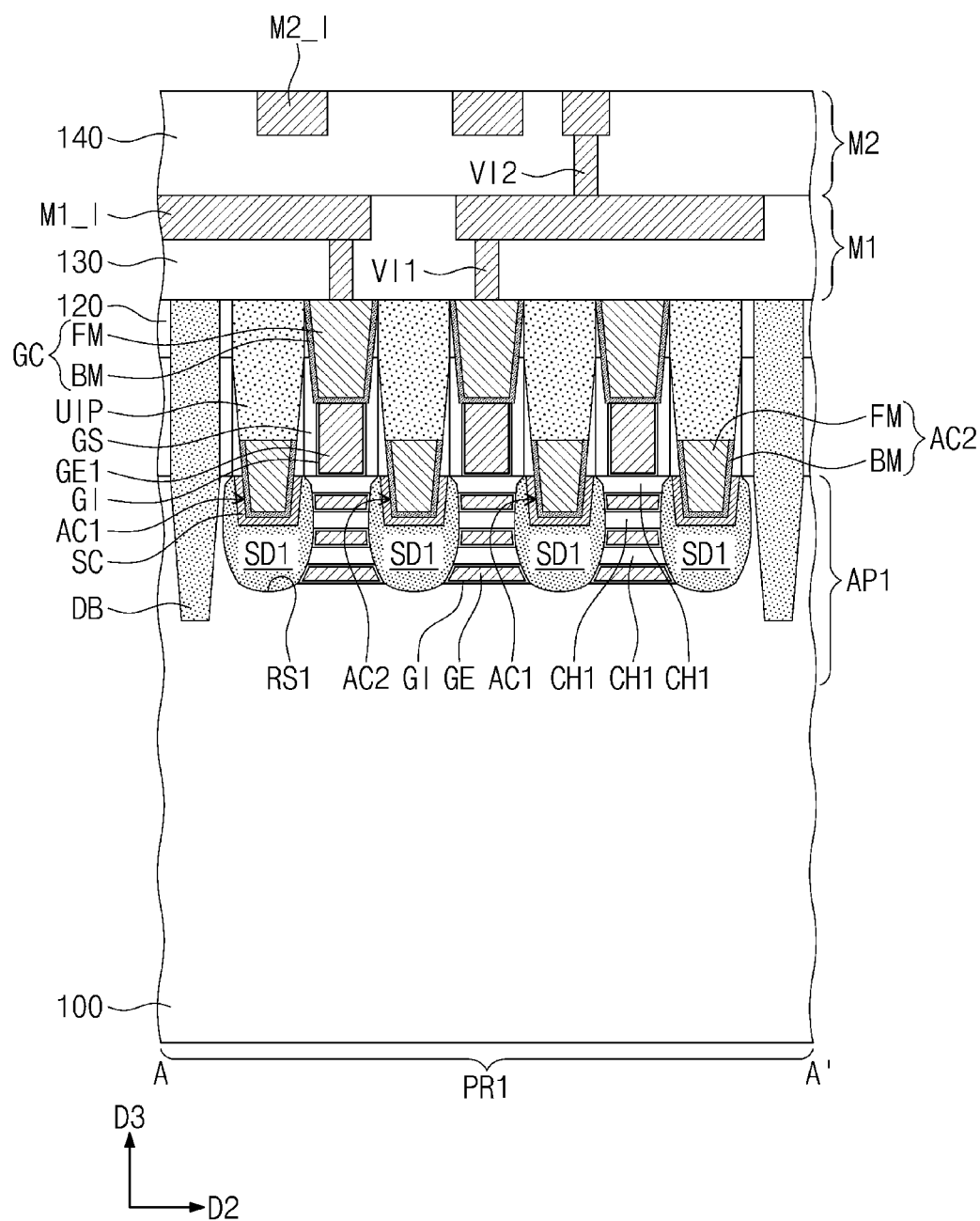
FIGS. 9A to 9D are sectional views, which are respectively taken along lines A-A', B-B', D-D', and E-E' of FIG. 1 to illustrate a semiconductor device according to an embodiment of the inventive concept.
Figure 9B:
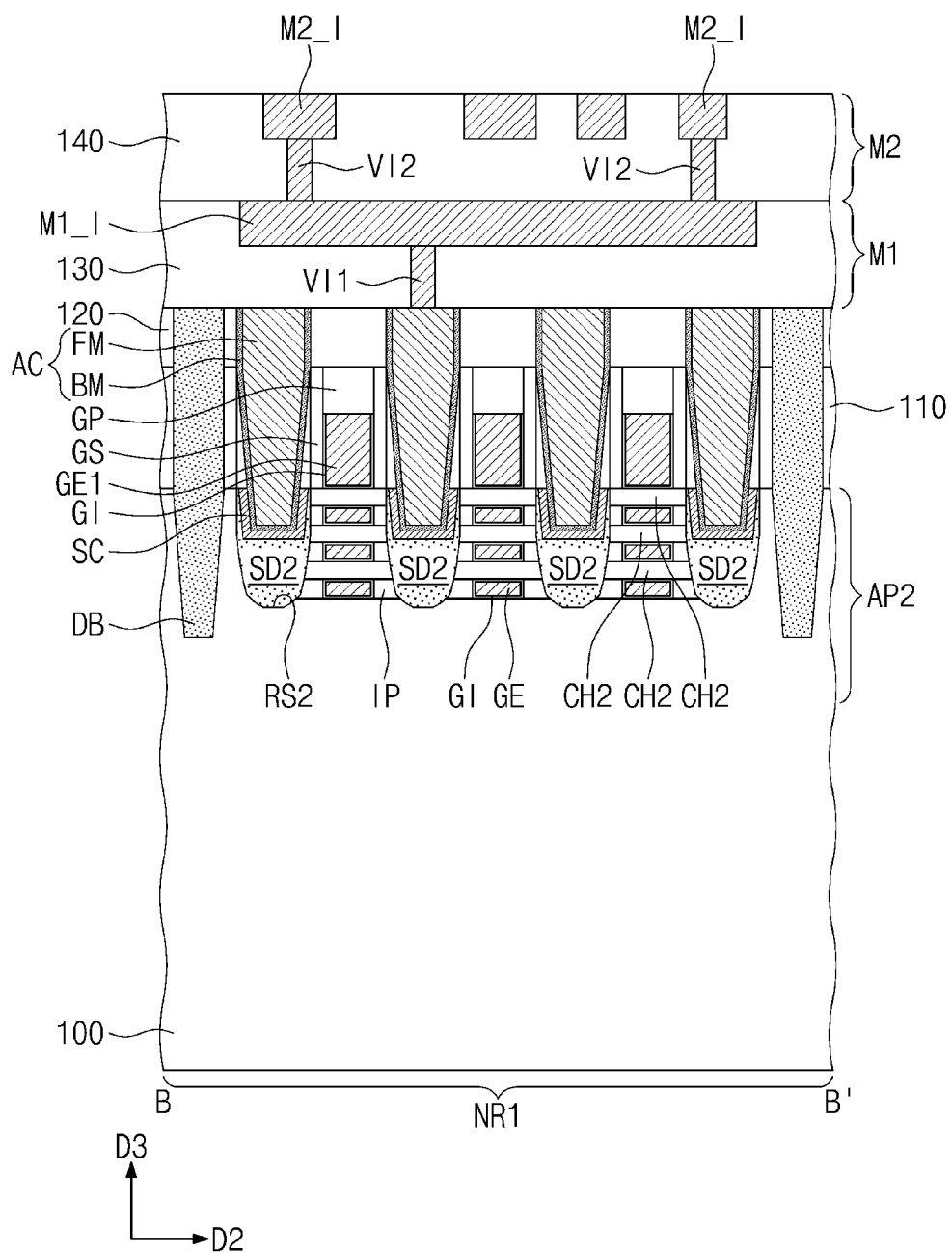
Figure 9C:
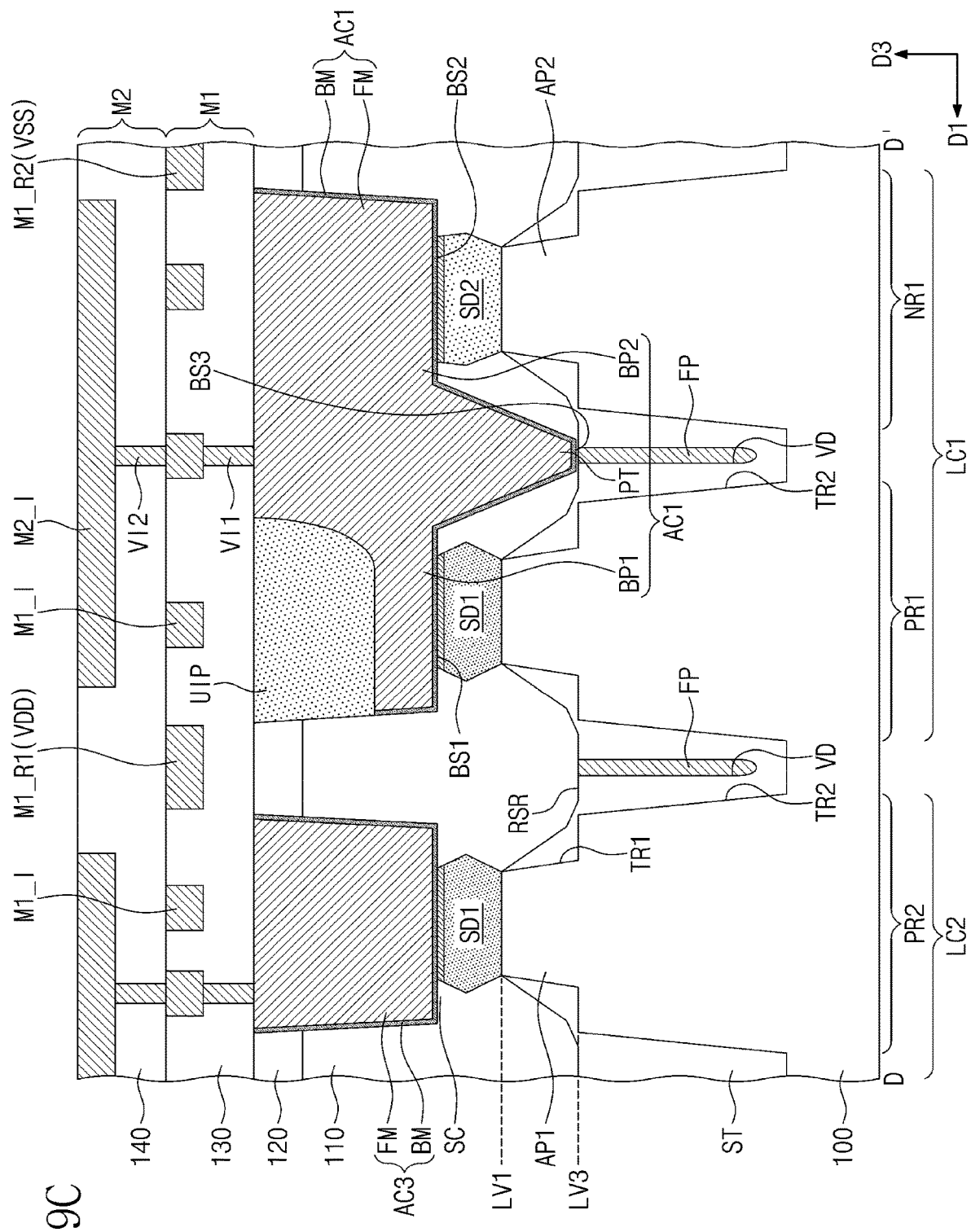
Figure 9D:
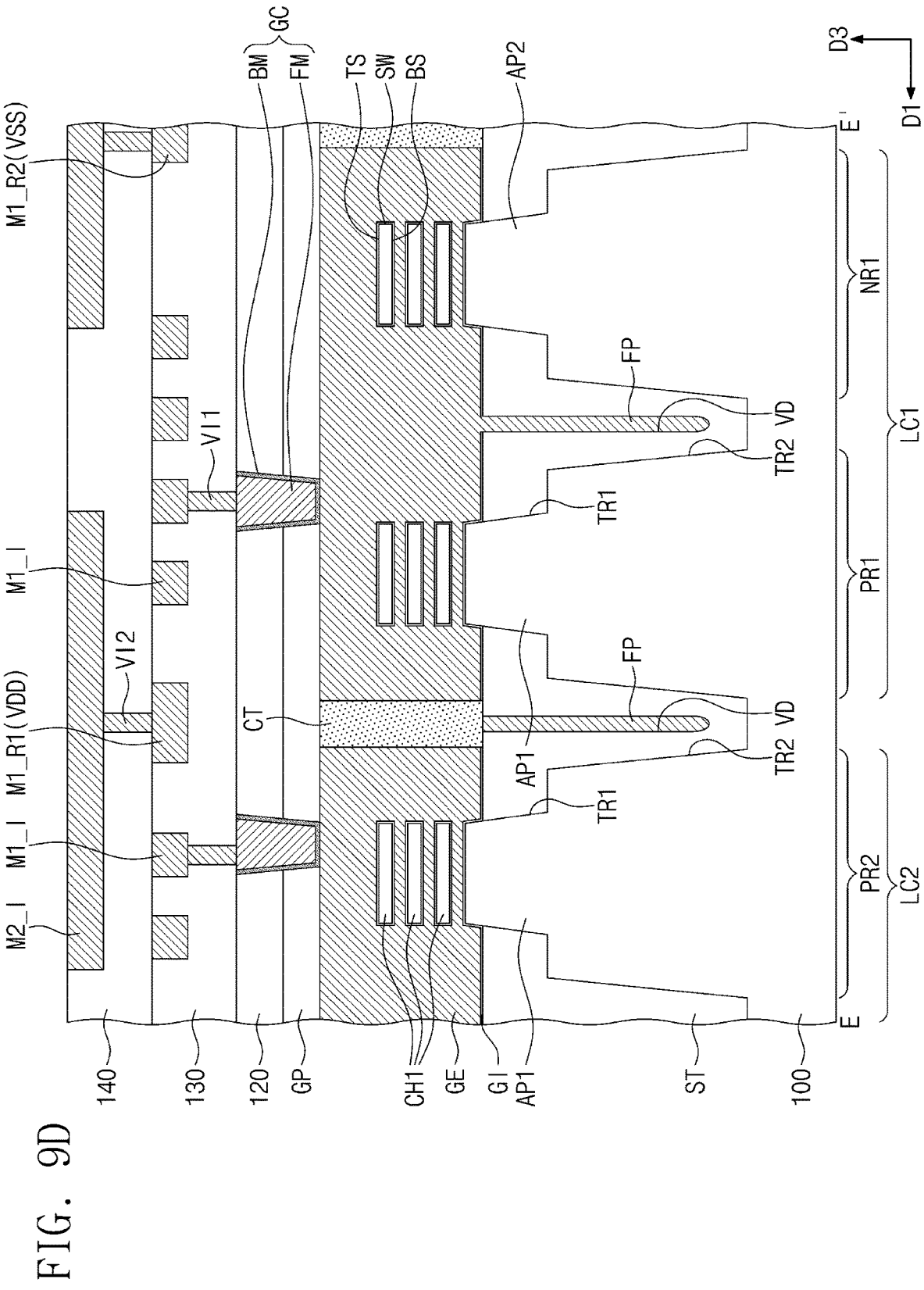

The first gate electrode GE1 may be provided to enclose each of the first and second channel patterns CH1 and CH2 (e.g., see FIG. 9D). The first gate electrode GE1 may be provided on a top surface TS, at least one side surface SW, and a bottom surface BS of each of the first and second channel patterns CH1 and CH2. For example, the first gate electrode GE1 may be provided to face the top surface TS, the bottom surface BS, and the side surfaces SW of each of the first and second channel patterns CH1 and CH2. For example, the first gate electrode GE1 may wrap around the top surface TS, the bottom surface BS, and the side surfaces SW of each of the first and second channel patterns CH1 and CH2. A transistor according to the present embodiment may be a three-dimensional field effect transistor (e.g., a multi bridge channel field effect transistor (MBCFET)), in which the first gate electrode GE1 is provided to surround the channel pattern CH1 or CH2 three-dimensionally. The first gate electrode GE1 extending in the first direction D1 may be divided into a plurality of the first gate electrodes GE1 by the gate cutting patterns CT.

The gate dielectric pattern GI may be provided between each of the first and second channel patterns CH1 and CH2 and the first gate electrode GE1. The gate dielectric pattern GI may be provided to enclose each of the first and second channel patterns CH1 and CH2.

On the first and second NMOSFET regions NR1 and NR2, an insulating pattern IP may be interposed between the gate dielectric pattern GI and the second source/drain pattern SD2. The gate electrode GE may be spaced apart from the second source/drain pattern SD2 by the gate dielectric pattern GI and the insulating pattern IP. By contrast, the insulating pattern IP may be omitted from the first and second PMOSFET regions PR1 and PR2.

The first interlayer insulating layer 110 and the second interlayer insulating layer 120 may be provided on the substrate 100. The active contacts AC may be provided to penetrate the first and second interlayer insulating layers 110 and 120 and may be connected to the first and second source/drain patterns SD1 and SD2, respectively. The gate contacts GC may be provided to penetrate the second interlayer insulating layer 120 and the gate capping pattern GP and may be connected to the first gate electrodes GE1, respectively.

The active contacts AC and the gate contacts GC may be configured to have substantially the same features as those described with reference to FIGS. 1 and 2A to 2H.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140. The first and second metal layers M1 and M2 may be configured to have substantially the same features as those described with reference to FIGS. 1 and 2A to 2H.

According to an embodiment of the inventive concept, by applying different voltages to first and second test lines and increasing the voltage difference in a voltage ramping manner, it may be possible to analyze a short-circuit failure in a non-destructive manner. Accordingly, it may be possible to reduce the time taken to analyze a short-circuit failure caused by a void in a device isolation layer. Furthermore, since it is possible to prevent loss of a wafer that is caused when the analysis process is executed in a destructive manner, the cost for the analysis process can be reduced. As a result, it is possible to analyze a failure in a semiconductor device in a cost-effective and easier manner.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate including a logic cell region and a test region, the logic cell region comprising a first active region and a second active region, which are spaced apart from each other in a first direction, and the test region comprising a plurality of dummy regions, which are spaced apart from each other in the first direction;
a first active pattern and a second active pattern provided on the first active region and the second active region, respectively;
a dummy pattern provided on each of the plurality of dummy regions;
a device isolation layer disposed in a plurality of trenches defining each of the dummy pattern, the first active pattern, and the second active pattern;
a contact pattern provided on the dummy pattern and contacting the dummy pattern;
a first gate electrode provided to cross the plurality of dummy regions and extended in the first direction;
a gate contact coupled to the first gate electrode; and
a first metal layer on the gate contact, wherein the first metal layer is disposed in the logic cell region and the test region,
wherein the first metal layer comprises a first test line and a second test line, which are provided on the test region and are respectively coupled to the contact pattern and the gate contact, and
wherein a top surface of the first active pattern is lower than a top surface of the dummy pattern.

2. The semiconductor device of claim 1,
wherein the gate contact is provided between two adjacent dummy regions among the plurality of dummy regions, when viewed in a plan view, and
wherein the contact pattern is adjacent to the first gate electrode and is extended in the first direction.

3. The semiconductor device of claim 1,
wherein the first metal layer further comprises a first via between the contact pattern and the first test line, and
wherein the first via vertically overlaps one of the plurality of dummy regions, when viewed in a plan view.

4. The semiconductor device of claim 1, further comprising:
a second metal layer only in the logic cell region,
wherein the second metal layer is disposed on only a portion, in the logic cell region, of the first metal layer.

5. The semiconductor device of claim 1, further comprising:
a first source/drain pattern on the first active pattern;
an active contact coupled to the first source/drain pattern; and
a silicide pattern between the active contact and the first source/drain pattern,
wherein the active contact is in contact with the silicide pattern, and
wherein the contact pattern is in contact with the top surface of the dummy pattern.

6. The semiconductor device of claim 1, further comprising:
a second gate electrode crossing the first active pattern;
a third gate electrode crossing the second active pattern, and
a gate cutting pattern interposed between the second gate electrode and the third gate electrode,
wherein the second gate electrode and the third gate electrode extend along a straight line extending in the first direction and are spaced apart from each other in the first direction.

7. The semiconductor device of claim 1,
wherein the device isolation layer comprises a void,
wherein the void is disposed between two adjacent dummy regions of the plurality of dummy regions and extends into one of the plurality of trenches, and
wherein the gate contact vertically overlaps the void.

8. The semiconductor device of claim 7, further comprising:
a gapfill pattern provided in the void, and
wherein the gapfill pattern comprises metal.

9. The semiconductor device of claim 1, further comprising:
a third active pattern disposed on the logic cell region and being adjacent to the first active pattern,
wherein the plurality of trenches comprise:

a first trench between the first active pattern and the second active pattern, and
a second trench between the first active pattern and the third active pattern, and
wherein the first trench is deeper than the second trench.

10. The semiconductor device of claim 1,
wherein a voltage applied to the first test line is different from a voltage applied to the second test line.

11. A semiconductor device, comprising:
a substrate including a test region, wherein the test region includes a plurality of dummy regions that are spaced apart from each other in a first direction;
a plurality of dummy patterns provided on the plurality of dummy regions;
a device isolation layer disposed in a plurality of trenches, each trench of the plurality of trenches being disposed between corresponding two adjacent dummy patterns of the plurality of dummy patterns;
a gate electrode provided to cross the plurality of dummy regions and extended in the first direction;
a contact pattern provided adjacent to the gate electrode and on a corresponding dummy pattern of the plurality of dummy patterns and extended in the first direction;
a gate contact provided on the gate electrode; and
a first metal layer provided on the gate contact,
wherein the first metal layer comprises:
a first test line and a second test line, which are respectively coupled to the contact pattern and the gate contact; and
a first via between the first test line and the contact pattern,
wherein the gate contact vertically overlaps the device isolation layer between two adjacent dummy regions of the plurality of dummy regions, and
wherein the contact pattern is in contact with a top surface of each of the plurality of dummy patterns.

12. The semiconductor device of claim 11,
wherein the substrate further comprises a logic cell region,
wherein the semiconductor device further comprises an active pattern provided on the logic cell region,
wherein the plurality of trenches define the active pattern and each of the plurality of dummy patterns, and
wherein a top surface of the active pattern is lower than a top surface of at least one of the plurality of dummy patterns.

13. The semiconductor device of claim 12,
wherein a top surface of the device isolation layer on the logic cell region comprises a recess region, which is recessed toward one of the plurality of trenches, and
wherein a top surface of the device isolation layer on the test region is flat.

14. The semiconductor device of claim 11,
wherein each of the first and second test lines is extended in the first direction.

15. The semiconductor device of claim 11,
wherein the first via vertically overlaps one of the plurality of dummy regions, when viewed in a plan view.

16. A semiconductor device, comprising:
a substrate including a logic cell region and a test region, the logic cell region comprising a first active region and a second active region, which are spaced apart from each other, the test region comprising a plurality of dummy regions, which are spaced apart from each other;
a first active pattern and a second active pattern provided on the first active region and the second active region, respectively;
a dummy pattern provided on each of the plurality of dummy regions;
a device isolation layer disposed in a plurality of trenches defining each of the dummy pattern, the first active pattern, and the second active pattern, each of the dummy pattern, the first active pattern, and the second active pattern protruding beyond a top surface of the device isolation layer;
a first gate electrode crossing the first active pattern and the second active pattern;
a second gate electrode crossing the dummy pattern;
a first source/drain pattern and a second source/drain pattern provided on the first active pattern and the second active pattern, respectively;
a gate spacer provided on a side surface of each of the first gate electrode and the second gate electrode;
a gate capping pattern provided on a top surface of each of the first gate electrode and the second gate electrode;
an interlayer insulating layer on the gate capping pattern;
an active contact penetrating the interlayer insulating layer and coupled to one of the first source/drain pattern and the second source/drain pattern;
a contact pattern penetrating the interlayer insulating layer and contacting the dummy pattern;
a pair of silicide patterns interposed between the active contact and each of the first source/drain pattern and the second source/drain pattern, respectively;
a first gate contact and a second gate contact penetrating the interlayer insulating layer and the gate capping pattern and being coupled to the first gate electrode and the second gate electrode, respectively;
a first metal layer on the interlayer insulating layer, the first metal layer comprising a power line, which is provided on the logic cell region, and a first test line and a second test line, which are provided on the test region; and
a second metal layer on the first metal layer,
wherein the power line is electrically connected to the active contact,
wherein the first test line is electrically connected to the contact pattern,
wherein the second test line is electrically connected to the second gate contact, and
wherein a top surface of the first active pattern is lower than a top surface of the dummy pattern.

17. The semiconductor device of claim 16,
wherein the second metal layer is electrically connected to the first metal layer on the logic cell region,
wherein the second metal layer is disposed only in the logic cell region, and
wherein the second metal layer is disposed on only a portion, in the logic cell region, of the first metal layer.

18. The semiconductor device of claim 16,
wherein the second gate contact vertically overlaps the device isolation layer between two adjacent dummy regions of the plurality of dummy regions, and
wherein the contact pattern is adjacent to the second gate electrode.

19. The semiconductor device of claim 16,
wherein the device isolation layer comprises a void,
wherein the void is disposed between two adjacent dummy regions of the plurality of dummy regions and extends into one of the plurality of trenches, and
wherein the first gate contact vertically overlaps the void.

20. The semiconductor device of claim 16,
wherein the first active pattern comprises a channel pattern connected to the first source/drain pattern, and
wherein the first gate electrode wraps around top, bottom, and side surfaces of the channel pattern.

* * * * *